United States Patent
Hara et al.

(10) Patent No.: US 11,848,503 B2
(45) Date of Patent: *Dec. 19, 2023

(54) SCANNING ANTENNA AND METHOD FOR MANUFACTURING SCANNING ANTENNA

(71) Applicants: Sharp Kabushiki Kaisha, Sakai (JP); KYMETA CORPORATION, Redmond, WA (US)

(72) Inventors: Takeshi Hara, Sakai (JP); Yoshinori Tanaka, Yonago (JP); Susumu Nakano, Yonago (JP); Ryan A. Stevenson, Redmond, WA (US); Steve Linn, Redmond, WA (US); Cagdas Varel, Redmond, WA (US); Colin Short, Redmond, WA (US); Felix Chen, Redmond, WA (US)

(73) Assignees: SHARP KABUSHIKI KAISHA, Sakai (JP); KYMETA CORPORATION, Redmond, WA (US)

(*) Notice: Subject to any disclaimer, the term of this patent is extended or adjusted under 35 U.S.C. 154(b) by 358 days.

This patent is subject to a terminal disclaimer.

(21) Appl. No.: 17/312,123

(22) PCT Filed: Dec. 2, 2019

(86) PCT No.: PCT/JP2019/047065
§ 371 (c)(1),
(2) Date: Jun. 9, 2021

(87) PCT Pub. No.: WO2020/121875
PCT Pub. Date: Jun. 18, 2020

(65) Prior Publication Data
US 2022/0037781 A1    Feb. 3, 2022

(30) Foreign Application Priority Data
Dec. 12, 2018 (JP) .................... 2018-232633

(51) Int. Cl.
*H01Q 3/30* (2006.01)
*H01Q 9/04* (2006.01)
*H01Q 19/10* (2006.01)

(52) U.S. Cl.
CPC ............. *H01Q 3/30* (2013.01); *H01Q 9/0407* (2013.01); *H01Q 19/10* (2013.01)

(58) Field of Classification Search
CPC ........ H01Q 3/44; H01Q 13/10; H01Q 21/064; H01Q 21/20
See application file for complete search history.

(56) References Cited

U.S. PATENT DOCUMENTS 7,466,269 B2    12/2008  Haziza
7,847,894 B2    12/2010  Rho
(Continued)

FOREIGN PATENT DOCUMENTS

JP    03-215828 A    9/1991
JP    2002-217640 A    8/2002
(Continued)

OTHER PUBLICATIONS

Stevenson et al., "Rethinking Wireless Communications: Advanced Antenna Design using LCD Technology", SID 2015 Digest, 55.2, 2015, pp. 827-830.
(Continued)

Primary Examiner — Seokjin Kim
(74) Attorney, Agent, or Firm — Keating & Bennett, LLP

(57) ABSTRACT

A scanning antenna includes a transmission and/or reception region including a plurality of antenna units and a non-transmission and/or reception region other than the transmission and/or reception region. The scanning antenna includes a TFT substrate, a slot substrate, a liquid crystal layer provided between the TFT substrate and the slot substrate, a seal portion provided in the non-transmission
(Continued)

and/or reception region and surrounding the liquid crystal layer, a reflective conductive plate disposed opposing a second main surface of a second dielectric substrate with a dielectric layer interposed between the reflective conductive plate and the second main surface, a first spacer structure defining a first gap between a first dielectric substrate and the second dielectric substrate in the transmission and/or reception region, and a second spacer structure defining a second gap between the first dielectric substrate and the second dielectric substrate in the non-transmission and/or reception region, the second gap being wider than the first gap. The second spacer structure is disposed within the seal portion or within a region surrounded by the seal portion.

15 Claims, 18 Drawing Sheets

(56) References Cited

U.S. PATENT DOCUMENTS

| | | | |
|---|---|---|---|
| 10,170,826 | B2 | 1/2019 | Nakazawa et al. |
| 2004/0032558 | A1 | 2/2004 | Liu et al. |
| 2012/0092577 | A1 | 4/2012 | Shi et al. |
| 2012/0138922 | A1 | 6/2012 | Yamazaki et al. |
| 2012/0194399 | A1 | 8/2012 | Bily et al. |
| 2013/0320334 | A1 | 12/2013 | Yamazaki et al. |
| 2014/0286076 | A1 | 9/2014 | Aoki et al. |
| 2018/0138593 | A1* | 5/2018 | Nakazawa ............... H01Q 3/46 |
| 2018/0294542 | A1 | 10/2018 | Minoura et al. |
| 2018/0337446 | A1 | 11/2018 | Nakazawa et al. |
| 2019/0036227 | A1* | 1/2019 | Linn ....................... H01Q 21/06 |
| 2022/0029300 | A1* | 1/2022 | Hara ....................... H01Q 13/22 |

FOREIGN PATENT DOCUMENTS

| | | |
|---|---|---|
| JP | 2004-078142 A | 3/2004 |
| JP | 2007-116573 A | 5/2007 |
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |
| WO | 2017/065088 A1 | 4/2017 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.

Wittek et al., "Liquid Crystals for Smart Antennas and Other Microwave Applications", SID 2015 Digest, 55.1, 2015, pp. 824-826.

Kuki, "Novel RF Functional Devices Using Liquid Crystal", Polymer, vol. 55, Aug. 2006, pp. 599-602.

* cited by examiner

SCANNING ANTENNA AND METHOD FOR MANUFACTURING SCANNING ANTENNA

TECHNICAL FIELD

The disclosure relates to a scanning antenna, more particularly, to a scanning antenna having antenna units (also referred to as an "element antennas") with liquid crystal capacitance (also referred to as a "liquid crystal array antenna") and a manufacturing method of the scanning antenna.

BACKGROUND ART

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

The present inventors have developed a scanning antenna which can be mass-manufactured by utilizing known manufacturing techniques of LCDs. PTL 6 by the present inventors discloses a scanning antenna which can be mass-manufactured by utilizing the known manufacturing techniques of LCDs, a TFT substrate used for such a scanning antenna, and a manufacturing method and a driving method of such a scanning antenna. For reference, the entire contents disclosed in PTL 6 are incorporated herein.

CITATION LIST

Patent Literature

PTL1: JP 2007-116573 A
PTL2: JP 2007-295044 A
PTL3: JP 2009-538565 A
PTL4: JP 2013-539949 A
PTL5: WO 2015/126550
PTL6: WO 2017/061527

Non Patent Literature

NPL 1: R. A. Stevenson et al., "Rethinking Wireless Communications: Advanced Antenna Design using LCD Technology", SID 2015 DIGEST, pp. 827-830.
NPL 2: M. ANDO et al., "A Radial Line Slot Antenna for 12 GHz Satellite TV Reception", IEEE Transactions of Antennas and Propagation, Vol. AP-33, No. 12, pp. 47-1353 (1985).

SUMMARY

Technical Problem

An object of the disclosure is to further improve the performance of the scanning antenna described in PTL6.

Solution to Problem

According to the embodiments of the disclosure, there are provided solutions according to the following items.

Item 1

A scanning antenna with a transmission and/or reception region including a plurality of antenna units and a non-transmission and/or reception region other than the transmission and/or reception region, the scanning antenna including:
  a TFT substrate including a first dielectric substrate and, a plurality of TFTs, a plurality of gate bus lines, a plurality of source bus lines, and a plurality of patch electrodes, supported by the first dielectric substrate;
  a slot substrate including a second dielectric substrate and a slot electrode formed on a first main surface of the second dielectric substrate, the slot electrode including a plurality of slots arranged corresponding to the plurality of patch electrodes;
  a liquid crystal layer provided between the TFT substrate and the slot substrate;
  a seal portion provided in the non-transmission and/or reception region and surrounding the liquid crystal layer;
  a reflective conductive plate disposed opposing a second main surface of the second dielectric substrate on a side opposite to the first main surface with a dielectric layer interposed between the reflective conductive plate and the second main surface,
  a first spacer structure disposed in the transmission and/or reception region, and defining a first gap between the first dielectric substrate and the second dielectric substrate in the transmission and/or reception region; and
  a second spacer structure defining a second gap between the first dielectric substrate and the second dielectric substrate in the non-transmission and/or reception region, the second gap being wider than the first gap, and
  wherein the second spacer structure is disposed within the seal portion or within a region surrounded by the seal portion.

Item 2

The scanning antenna according to Item 1,
  wherein the liquid crystal layer contains a vacuum bubble when a temperature of the liquid crystal layer is 25° C., and the liquid crystal layer does not contain a vacuum bubble when a temperature of the liquid crystal layer is 120° C. or higher.

Item 3

The scanning antenna according to Item 1 or 2,
  wherein the first spacer structure includes a first columnar spacer defining a thickness of the liquid crystal layer between the plurality of patch electrodes and the slot electrode, and
  the second spacer structure includes a spacer higher than the first columnar spacer.

Item 4

The scanning antenna according to any one of Items 1 to 3, wherein the seal portion includes a first granular spacer defining a thickness of the liquid crystal layer in the transmission and/or reception region, and the second spacer structure includes a second granular spacer having a particle diameter greater than the first granular spacer.

Item 5

The scanning antenna according to any one of Items 1 to 4, wherein the second spacer structure is disposed within the seal portion.

Item 6

The scanning antenna according to any one of Items 1 to 5, further including:

a third spacer structure defining a third gap between the first dielectric substrate and the second dielectric substrate in the non-transmission and/or reception region, and disposed within the region surrounded by the seal portion, the third gap being wider than the first gap; and an additional seal portion including the third spacer structure.

Item 7

The scanning antenna according to Item 6, wherein assuming, when viewed from a normal direction of the first dielectric substrate, a smallest rectangle containing the TFT substrate and the slot substrate, the additional seal portion includes a portion formed in a region along a side where a notch from the rectangle is the largest.

Item 8

The scanning antenna according to Item 6 or 7, wherein a height of the third spacer structure is greater than a height of the second spacer structure.

Item 9

The scanning antenna according to any one of Items 6 to 8, wherein the region surrounded by the seal portion includes an active region including the transmission and/or reception region, and a buffer region other than the active region, and the additional seal portion is provided between the active region and the buffer region.

Item 10

The scanning antenna according to Item 9, wherein the seal portion includes a main seal portion defining an injection port and an end seal portion sealing the injection port, and the additional seal portion is formed such that liquid crystal material injected from the injection port is filled through the active region into the buffer region.

Item 11

The scanning antenna according to Item 9 or 10, wherein the buffer region includes a region having a width of 5 mm to 15 mm.

Item 12

A method for manufacturing the scanning antenna, the scanning antenna being according to any one of Items 1 to 11, the method including:

a step for forming the liquid crystal layer, the step for forming the liquid crystal layer includes a step for supplying liquid crystal material to generate a vacuum bubble within a region between the TFT substrate and the slot substrate, and surrounded by the seal portion.

Item 13

The method for manufacturing the scanning antenna according to Item 12, wherein the step for forming the liquid crystal layer further includes a step for increasing the temperature of the liquid crystal layer to 120° C. or more after the step for supplying the liquid crystal material.

Item 14

The method for manufacturing the scanning antenna according to Item 12 or 13, wherein the liquid crystal layer is formed using a vacuum injection method.

Item 15

The method for manufacturing the scanning antenna according to Item 12 or 13, wherein the liquid crystal layer is formed using one drop filling, and the step for forming the liquid crystal layer includes a step for dropping an amount of liquid crystal material smaller than a volume of the region between the TFT substrate and the slot substrate, and surrounded by the seal portion.

Advantageous Effects of Disclosure

According to an embodiment of the disclosure, the performance of the scanning antenna can be further improved.

BRIEF DESCRIPTION OF DRAWINGS

FIGS. 5(a) to 5(c) are schematic cross-sectional views of the liquid crystal panel 100a.

DESCRIPTION OF EMBODIMENTS

Figure 1:
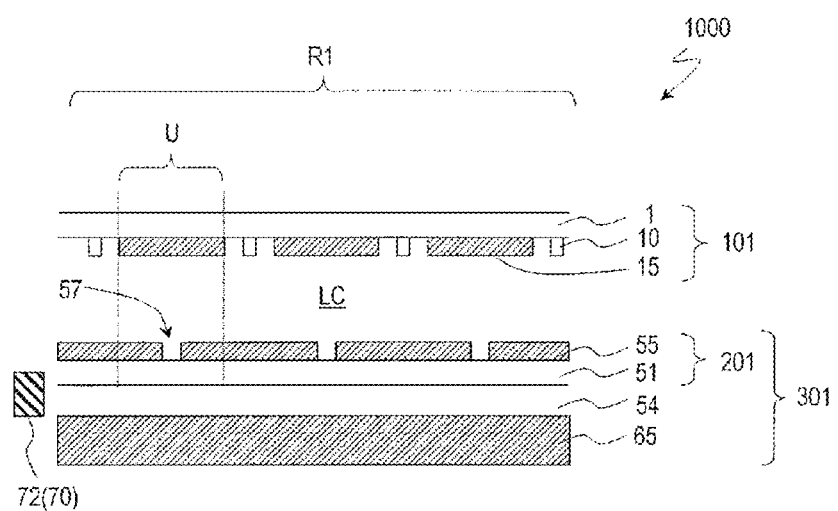
FIG. 1 is a cross-sectional view schematically illustrating a portion of a scanning antenna 1000.

Hereinafter, a scanning antenna, a method for manufacturing the scanning antenna, and a TFT substrate used for the scanning antenna according to embodiments of the disclosure will be described with reference to the drawings. Note that the disclosure is not limited to the embodiments illustrated below. The embodiments of the disclosure are not limited to the drawings. For example, a thickness of a layer in a cross-sectional view, sizes of a conductive portion and an opening in a plan view, and the like are exemplary.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." For a description of the basic structure and operating principles of a scanning antenna that uses a liquid crystal material, refer to PTL1 to PTL4 as well as NPL 1 and NPL 2. NPL 2 discloses the basic structure of a scanning antenna in which spiral slots are arranged. For reference, the entire contents of the disclosures of PTL1 to PTL4 as well as NPL 1 and NPL 2 are incorporated herein.

Note that although the antenna units in the scanning antenna are similar to pixels in an LCD panel, the structure of the antenna units is different from the structure of pixels in an LCD panel, and the arrangement of the plurality of antenna units is also different from the arrangement of pixels in an LCD panel. A basic structure of the scanning antenna will be described with reference to FIG. 1, which illustrates a scanning antenna 1000 described in PTL6. The scanning antenna 1000 is a radial in-line slot antenna in which slots are concentrically arranged. However, the scanning antenna according to embodiments of the disclosure is not limited thereto. For example, the slots may be arranged in any known arrangement. In particular, with respect to the slot and/or antenna unit arrangements, the entire disclosure of PTL5 is incorporated herein by reference.

FIG. 1 is a cross-sectional view schematically illustrating a portion of the scanning antenna 1000, and schematically illustrates a part of the cross-section along the radial direction from a power feed pin 72 (refer to FIG. 2(b)) provided at or near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and/or receives microwaves to and/or from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (e.g., a fluorine resin such as PTFE) having a small dielectric constant M for microwaves can be used. The slot electrode 55, the reflective conductive plate 65, and the dielectric substrate 51 and the air layer 54 therebetween function as a waveguide 301.

The patch electrode 15, the portion of the slot electrode 55 including the slot 57, and the liquid crystal layer LC therebetween constitute an antenna unit U. In each antenna unit U, one patch electrode 15 opposes a portion of the slot electrode 55 including one slot 57 with the liquid crystal layer LC interposed therebetween, thereby constituting liquid crystal capacitance. The structure in which the patch electrode 15 and the slot electrode 55 oppose each other with the liquid crystal layer LC interposed therebetween is similar to the structure in which the pixel electrode and the counter electrode in an LCD panel oppose each other with the liquid crystal layer interposed therebetween. That is, the antenna unit U of the scanning antenna 1000 and the pixel in an LCD panel have a similar configuration. The antenna unit has a configuration similar to that of the pixel in an LCD panel in that the antenna unit has an auxiliary capacity electrically connected in parallel with the liquid crystal capacitance. However, the scanning antenna 1000 has many differences from the LCD panel.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as tan $\delta_M$). The tan $\delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large tan $\delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer.

Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 μm to 30 μm. In a case where the thin film deposition methods are used, the thickness of the metal layer is preferably less than or equal to 5 μm. Note that aluminum plates, copper plates, or the like having a thickness of several mm can be used as the reflective conductive plate 65, for example.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass manufacture, it is preferable to use an Al layer rather than a Cu layer, and the thickness of the Al layer is preferably greater than or equal to 0.3 μm and less than or equal to 2 μm, for example.

The arrangement pitch of the antenna units U is considerably different from that of the pixel pitch. For example, considering an antenna for microwaves of 12 GHz (Ku band), the wavelength λ is 25 mm, for example. Then, as described in PTL4, since the pitch of the antenna unit U is less than or equal to λ/4 and/or less than or equal to λ/5, the pitch becomes less than or equal to 6.25 mm and/or less than or equal to 5 mm. This is ten times greater than the pitch of pixels in an LCD panel. Accordingly, the length and width of the antenna unit U are also roughly ten times greater than the pixel length and width of the LCD panel.

Of course, the array of the antenna units U may be different from the array of the pixels in the LCD panel. Herein, although an example is illustrated in which the antenna units U are arrayed concentrically (for example, refer to JP 2002-217640 A), the present disclosure is not limited thereto, and the antenna units may be arrayed in a spiral shape as described in NPL 2, for example. Furthermore, the antenna units may be arrayed in a matrix as described in PTL4.

The properties required for the liquid crystal material of the liquid crystal layer LC of the scanning antenna 1000 are different from the properties required for the liquid crystal material of the LCD panel. In the LCD panel, a change in refractive index of the liquid crystal layer of the pixels allows a phase difference to be provided to the polarized visible light (wavelength of from 380 nm to 830 nm) such that the polarization state is changed (for example, allowing the polarization axis direction of linearly polarized light to be rotated or the degree of circular polarization of circularly polarized light to be changed), whereby display is performed. In contrast, in the scanning antenna 1000, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M ($\varepsilon_M$) for microwaves, and tan $\delta_M$ is preferably small. For example, the $\Delta\varepsilon_M$ of greater than or equal to 4 and tan $\delta_M$ of less than or equal to 0.02 (values of 19 GHz in both cases) described in SID 2015 DIGEST pp. 824-826 written by M. Witteck et al, can be suitably used. In addition, it is possible to use a liquid crystal material having a $\Delta\varepsilon_M$ of greater than or equal to 0.4 and tan $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy $\Delta n$ with respect to visible light. Accordingly, it can be said that a material having a large refractive index anisotropy $\Delta_n$ with respect to visible light is preferable as a liquid crystal material for an antenna unit for microwaves. The refractive index anisotropy $\Delta_n$ of the liquid crystal material for LCDs is evaluated by the refractive index anisotropy for light having a wavelength of 550 nm. Here again, when $\Delta_n$ (birefringence index) is used as an index for light having a wavelength of 550 nm, a nematic liquid crystal having a $\Delta_n$ of greater than or equal to 0.3, preferably greater than or equal to 0.4, can be used for an antenna unit for microwaves. The value $\Delta_n$ has no particular upper limit. However, since liquid crystal materials having a large $\Delta n$ tend to have a strong polarity, there is a possibility that reliability may decrease. The thickness of the liquid crystal layer is, for example, from 1 μm to 500 μm.

Hereinafter, the structure of the scanning antenna will be described in more detail.

Figure 2:
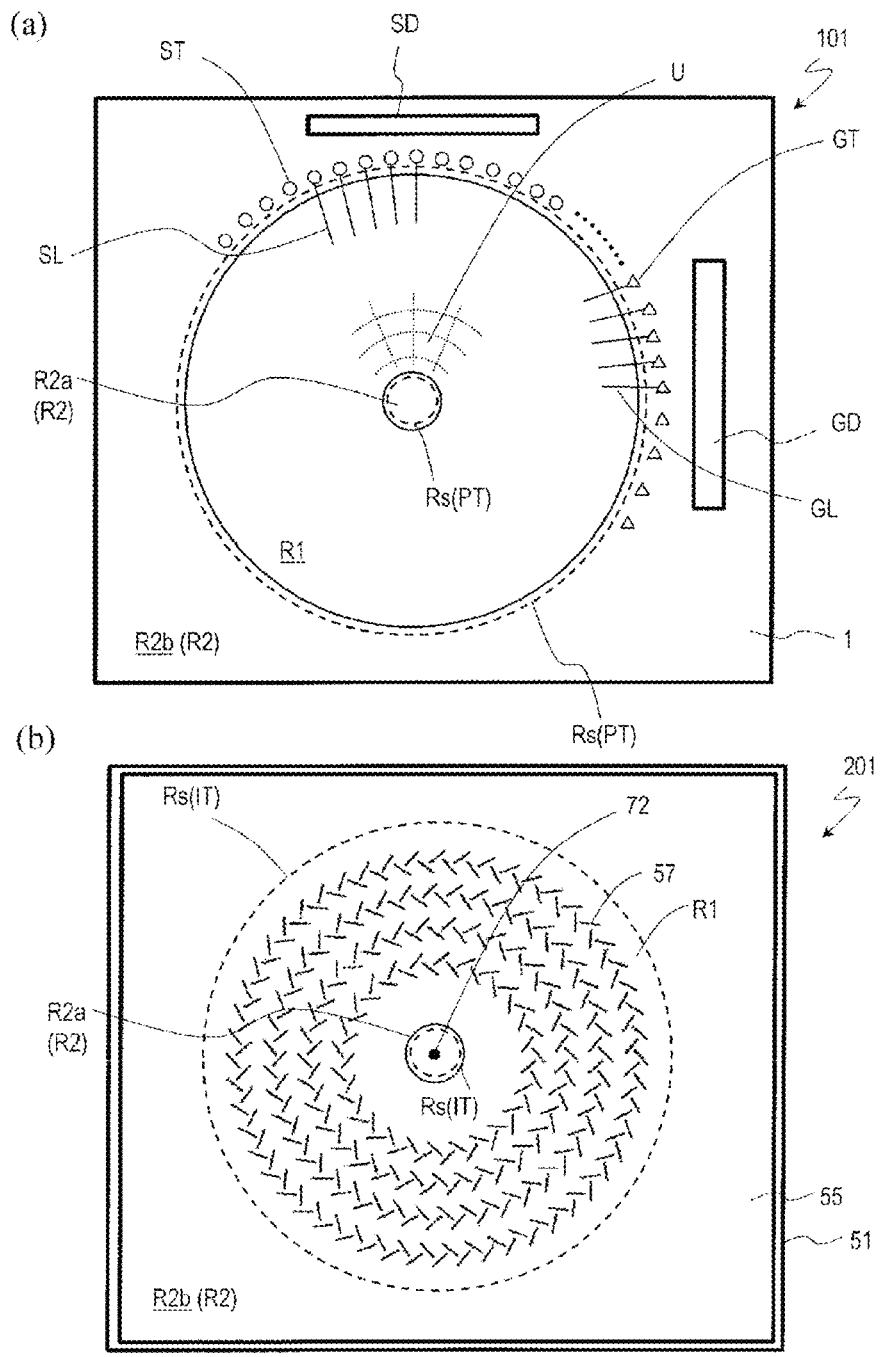
FIGS. 2(a) and 2(b) are schematic plan views illustrating a TFT substrate 101 and a slot substrate 201 included in the scanning antenna 1000, respectively.

First, a description is given with reference to FIG. 1 and FIG. 2. FIG. 1 is a schematic partial cross-sectional view of the scanning antenna 1000 near the center thereof as described above in detail, and FIGS. 2(a) and 2(b) are schematic plan views illustrating the TFT substrate 101 and the slot substrate 201 included in the scanning antenna 1000, respectively.

The scanning antenna 1000 includes a plurality of the antenna units U arranged two-dimensionally. In the scanning antenna 1000 exemplified here, the plurality of antenna units U are arranged concentrically. In the following description, the region of the TFT substrate 101 and the region of the slot substrate 201 corresponding to the antenna unit U will be referred to as "antenna unit region," and be denoted with the same reference numeral U as the antenna unit. In addition, as illustrated in FIGS. 2(a) and 2(b), in the TFT substrate 101 and the slot substrate 201, a region defined by the plurality of antenna unit regions that are two-dimensionally arranged is referred to as a "transmission and/or reception region R1," and a region other than the transmission and/or reception region R1 is referred to as a "non-transmission and/or reception region R2." A terminal section, a driving circuit, and the like are provided in the non-transmission and/or reception region R2.

FIG. 2(a) is a schematic plan view illustrating the TFT substrate 101 included in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2a located at the center of the transmission and/or reception region R1 and a second non-transmission and/or reception region R2b located at a peripheral portion of the transmission and/or reception region R1. An outer diameter of the transmission and/or reception region R1, for example, is from 200 mm to 1500 mm and is configured according to communication traffic volume or other factors.

A plurality of gate bus lines GL and a plurality of source bus lines SL supported by the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member is applied to the seal region Rs. The sealing member bonds the TFT substrate 101 and the slot substrate 201 to each other, and also encloses liquid crystals between these substrates 101 and 201.

A gate terminal section GT, a gate driver GD, a source terminal section ST, and a source driver SD are provided outside a region of the non-transmission and/or reception region R2 surrounded by the seal region Rs. Each of the gate bus lines GL is connected to the gate driver GD with the gate terminal section GT interposed therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2(b)) of the slot substrate 201. In the present specification, the connection section between the transfer terminal sections PT and the slot electrode 55 is referred to as a "transfer section." As illustrated in the drawings, the transfer terminal sections PT (transfer section) may be disposed in the seal region Rs. In this case, a resin containing conductive particles may be used as the sealing member. In this way, liquid crystals are sealed between the TFT substrate 101 and the slot substrate 201, and an electrical connection can be secured between the transfer terminal sections PT and the slot electrode 55 of the slot substrate 201. In this example, although a transfer terminal section PT is disposed in both the first non-transmission and/or reception region R2a and the second non-transmission and/or reception region R2b, the transfer terminal sections PT may be disposed in only one of the first non-transmission and/or reception region R2a and the second non-transmission and/or reception region R2b.

Note that the transfer terminal sections PT (transfer sections) need not be disposed in the seal region Rs. For example, the transfer terminal sections PT may be disposed in a region of the non-transmission and/or reception region R2 other than the seal region Rs. Needless to say, the transfer sections may be disposed both within the seal region Rs and outside the seal region Rs.

FIG. 2(b) is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, the plurality of slots 57 are formed in the slot electrode 55. The slots 57 are formed corresponding to the antenna unit regions U on the TFT substrate 101. For the plurality of slots 57 in the illustrated example, a pair of slots 57 extending in directions substantially orthogonal to each other are concentrically arranged so that a radial in-line slot antenna is configured. Since the scanning antenna 1000 includes slots that are substantially orthogonal to each other, the scanning antenna 1000 can transmit and/or receive circularly polarized waves.

A plurality of terminal sections IT of the slot electrode 55 are provided in the non-transmission and/or reception region R2. The terminal section IT is electrically connected to the transfer terminal section PT (FIG. 2(*a*)) of the TFT substrate 101. In this example, the terminal sections IT are disposed within the seal region Rs and are electrically connected to corresponding transfer terminal sections PT using a sealing member containing conductive particles.

In addition, the power feed pin 72 is disposed on a back face side of the slot substrate 201 in the first non-transmission and/or reception region R2*a*. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arranged. The power feed method may be either a direct coupling power feed method or an electromagnetic coupling method, and a known power feed structure can be utilized.

Figure 3:
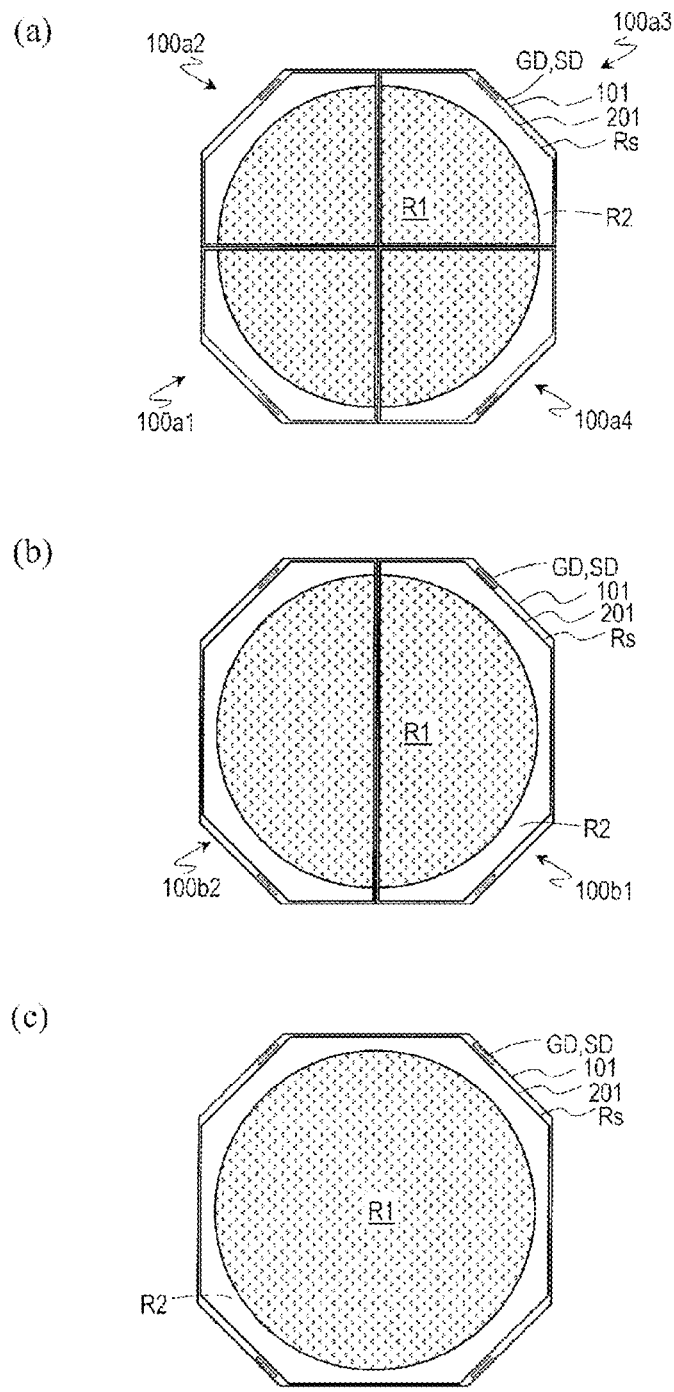
FIGS. 3(a) to 3(c) are diagrams illustrating an example of a tiling structure of the scanning antenna 1000.

In FIGS. 2(*a*) and 2(*b*), an example is illustrated in which the seal region Rs is provided so as to surround a relatively narrow region including the transmission and/or reception region R1, but the arrangement of the seal region Rs is not limited to this. For example, as illustrated in an example of FIG. 3, the seal region Rs provided outside the transmission and/or reception region R1 may be provided at or near the side of the dielectric substrate 1 and/or the dielectric substrate 51, for example, so as to maintain a certain distance or more from the transmission and/or reception region R1. Specifically, in the example illustrated in FIG. 3, a region surrounded by the seal region Rs includes the transmission and/or reception region R1 and a portion of the non-transmission and/or reception region R2. Of course, the terminal section and the drive circuit (including the gate driver GD and the source driver SD), for example, that are provided in the non-transmission and/or reception region R2 may be formed outside the region surrounded by the seal region Rs (that is, the side where the liquid crystal layer is not present). In general, the portion of the TFT substrate 101 including a terminal section and a drive circuit (e.g., the gate driver GD, the source driver SD, the source terminal section ST, and the gate terminal section GT) is exposed without overlapping the slot substrate 201. In FIG. 3, for simplicity, an edge of the slot substrate 201 and the seal region Rs (seal portion) are illustrated without distinction, but the edge of the slot substrate 201 is between the seal region Rs (seal portion) and an edge of the TFT substrate 101. The following drawings may also be similarly illustrated for simplicity. By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

The scanning antenna 1000 may be prepared by tiling a plurality of scanning antenna portions as described in, for example, WO 2017/065088 filed by the present applicant. For example, the scanning antenna can be prepared by dividing the liquid crystal panels of the scanning antenna. The liquid crystal panels of the scanning antenna each include: a TFT substrate; a slot substrate; and a liquid crystal layer provided therebetween. The air layer (or other dielectric layer) 54 and the reflective conductive plate 65 may be provided in common across the plurality of scanning antenna portions.

FIGS. 3(*a*) to 3(*c*) illustrate examples of the tiled structure of the liquid crystal panel included in the scanning antenna 1000. For example, the liquid crystal panel of the scanning antenna 1000 may be prepared by tiling four liquid crystal panels 100*a*1 to 100*a*4 as illustrated in FIG. 3(*a*), or by tiling two liquid crystal panels 100*b*1 and 100*b*2 as illustrated in FIG. 3(*b*). Of course, as illustrated in FIG. 3(*c*), a liquid crystal panel 100*f* may be fabricated without being divided. For simplicity, constituent elements included in the scanning antenna portions may be denoted by reference signs the same as the scanning antenna.

As described above, the scanning antenna controls the voltage applied to each liquid crystal layer of each antenna unit to change the effective dielectric constant $M(\varepsilon_M)$ of the liquid crystal layer for each antenna unit, and thereby, forms a two-dimensional pattern by antenna units with different electrostatic capacitances. However, the electrostatic capacitance values of the antenna units may vary. For example, the volume of liquid crystal material may change depending on the environment temperature of the scanning antenna, and therefore the electrostatic capacitance value of the liquid crystal capacitance may change. As a result, the phase difference given by the liquid crystal layer of the antenna unit to the microwave deviates from a predetermined value. In a case where the phase difference deviates from a predetermined value, the antenna characteristics are deteriorated. This deterioration of the antenna characteristics can be evaluated as a shift in the resonance frequency, for example. In reality, because the scanning antenna is designed to, for example, maximize gain at a predetermined resonance frequency, a reduction in antenna characteristics due to a shift in the resonance frequency appears as a change in gain, for example. Alternatively, in a case where the direction in which the gain of the scanning antenna is maximized deviates from the desired direction, the communication satellite cannot be accurately tracked, for example.

Figure 4:
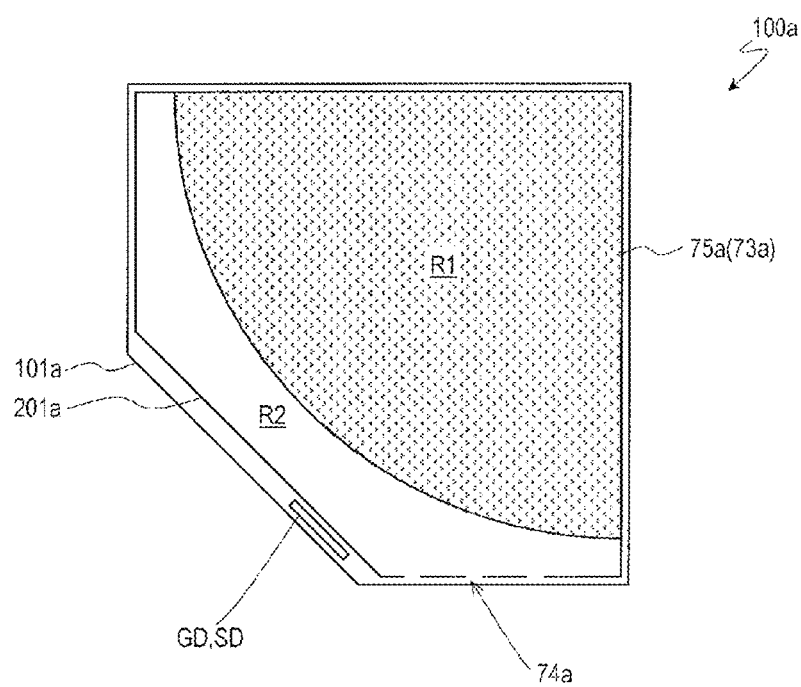
FIG. 4 is a schematic plan view illustrating a liquid crystal panel 100a included in the scanning antenna 1000.
Figure 5:
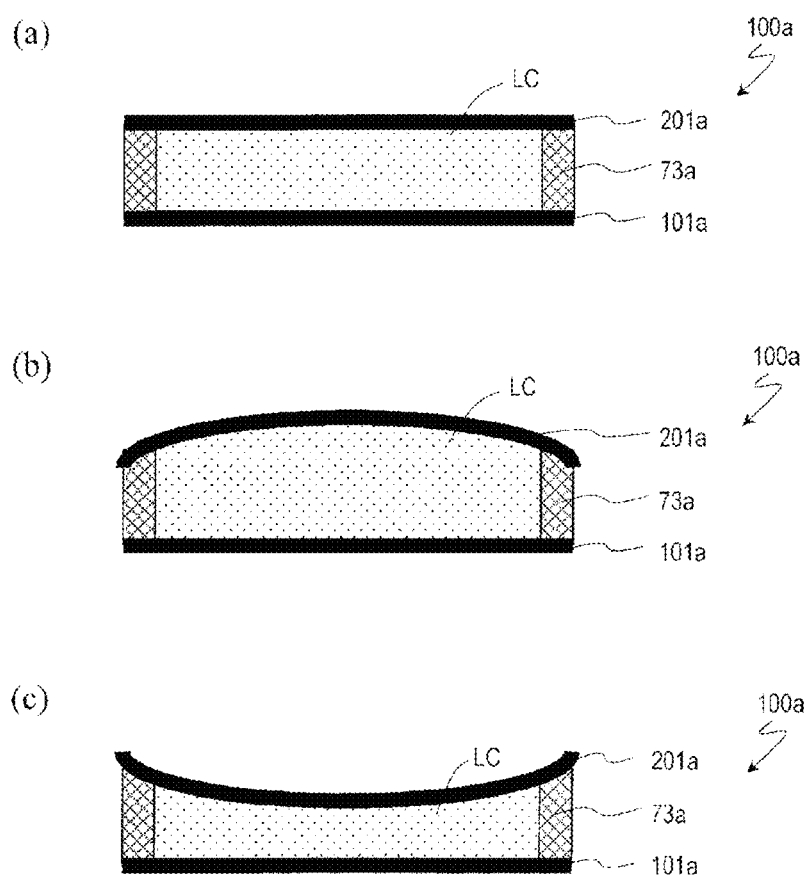

With reference to FIG. 4 and FIG. 5, changes in the thickness of the liquid crystal layer that may cause reduction in antenna performance in the scanning antenna 1000 will be specifically described.

FIG. 4 is a schematic plan view of one liquid crystal panel 100*a* for preparing a liquid crystal panel of the scanning antenna 1000 by tiling four liquid crystal panels. The liquid crystal panel 100*a* includes a TFT substrate 101*a*, a slot substrate 201*a*, a liquid crystal layer LC provided therebetween, and a seal portion 73*a* surrounding the liquid crystal layer LC. The slot substrate 201*a* and the TFT substrate 101*a* are adhered and fixed to each other by a sealing member that forms the seal portion 73*a*. For example, the seal portion 73*a* includes a main seal portion 75*a* and an end seal portion (not illustrated). In the illustrated example, the seal portion 73*a* is formed to surround the transmission and/or reception region R1 and a portion of the non-transmission and/or reception region R2. The non-transmission and/or reception region R2 is a region other than the transmission and/or reception region R1, as described above.

The seal portion 73*a* is formed as follows. First, a sealing member is used to draw a pattern having an opening at portion serving as an injection port 74*a* on one of the slot substrate 201*a* and the TFT substrate 101*a* using, for example, a dispenser. Instead of using a dispenser to draw with the sealing member, the sealing member may be applied in a predetermined pattern by screen printing, for example. After that, the substrates and other substrates are overlaid on one another, and heated for a predetermined time at a predetermined temperature to cure the sealing member. A granular spacer (e.g., resin beads) for controlling the cell gap is mixed into the sealing member, and the slot substrate 201a and the TFT substrate 101a are bonded and fixed to each other with a gap, in which the liquid crystal layer LC is formed, being maintained therebetween. Accordingly, the main seal portion 75a is formed.

Next, the liquid crystal layer LC is formed. A liquid crystal material is injected through the injection port 74a using vacuum injection. Then, for example, a thermosetting-type sealant is applied to close the injection port 74a, and the sealant is heated at a predetermined temperature for a predetermined time, to thereby cure the sealant and form the end seal portion. In a case where vacuum injection is used, the main seal portion 75a and the end seal portion form the entire seal portion 73a surrounding the liquid crystal layer LC in this way. Note that the liquid crystal layer LC may be formed using one drop filling. In the case where one drop filling is used, the main seal portion is formed to surround the liquid crystal layer LC, and thus, the injection port and the end seal portion are not formed.

FIGS. 5(a) to 5(c) are schematic cross-sectional views of the liquid crystal panel 100a. FIG. 5(a) illustrates a state immediately after the liquid crystal layer LC is formed (at a room temperature (for example, 25° C.)). FIG. 5(b) illustrates a state in which the volume of liquid crystal material increases (for example, due to increase in the temperature) from the state in FIG. 5(a), and FIG. 5(c) illustrates a state in which the volume of liquid crystal material decreases (for example, due to decrease in the temperature) from the state in FIG. 5(a).

As illustrated in FIG. 5(a), immediately after the liquid crystal layer LC is formed, a vacuum bubble is little generated in the liquid crystal layer LC. In a process for forming the liquid crystal layer, an insufficient supply amount of liquid crystal material causes a state in which the liquid crystal material is locally insufficient, which may result in an air bubble (also referred to as "vacuum bubble") generation. In a case where a vacuum bubble is generated in the liquid crystal layer LC of the antenna unit, an electrostatic capacitance value of the liquid crystal capacitance changes, which may lead to a decrease in antenna characteristics. Therefore, in order to avoid the vacuum bubble generation in the liquid crystal layer, the supply amount of liquid crystal material is generally prevented from being insufficient in the process for forming the liquid crystal layer.

In a case where the volume of liquid crystal material included in the liquid crystal layer not having a vacuum bubble as illustrated in FIG. 5(a) changes, the thickness of the liquid crystal layer LC changes due to deflection of the dielectric substrate 1 included in the TFT substrate 101a and/or the dielectric substrate 51 included in the slot substrate 201a, as illustrated in FIG. 5(b) and FIG. 5(c). The dielectric substrates 1 and 51 are, for example, glass substrates. In a case where the liquid crystal material expands, the thickness of the liquid crystal layer LC increases, and in a case where the liquid crystal material shrinks, the thickness of the liquid crystal layer LC decreases. Note that while FIG. 5(b) and FIG. 5(c) illustrate only the deflection of the slot substrate 201a for easy understanding, the deflection of the TFT substrate 101a is not excluded. In addition, since the seal portion 73a includes the granular spacer, for example, for controlling the cell gap, a change in a distance between the TFT substrate 101a and the slot substrate 201a in the seal portion 73a may be smaller as compared to the deflection of the TFT substrate 101a and/or the slot substrate 201a.

Note that in practice, a columnar spacer (photo spacer) for controlling the cell gap is provided in the transmission and/or reception region RE Specifically, in order to make the thickness of the liquid crystal layer LC uniform, a columnar photo spacer formed using an ultraviolet-curing resin is disposed on at least one of the TFT substrate 101a and the slot substrate 201a. Therefore, even in a case where the temperature decreases and the liquid crystal material thermally shrinks, the change in the cell gap is suppressed by the columnar spacer, and thus, the deflection of the TFT substrate 101a and/or the slot substrate 201a is suppressed to some degree as illustrated in FIG. 5(c). However, because the columnar spacer does not follow the decrease in the volume of liquid crystal material due to thermal shrinkage, a vacuum bubble may be generated around the columnar spacer at a low temperatures. A vacuum bubble generated in this manner is also referred to as a "low-temperature air bubble". Due to the vacuum bubble generated around the columnar spacers in the transmission and/or reception region R1, the electrostatic capacitance value of the liquid crystal capacitance may change, and as a result, the antenna characteristics may decrease.

In contrast, as described with reference to FIGS. 6 and 7, the scanning antenna according to an embodiment of the disclosure can suppress the reduction in the antenna performance at from a high temperature to a low temperature.

Figure 6:
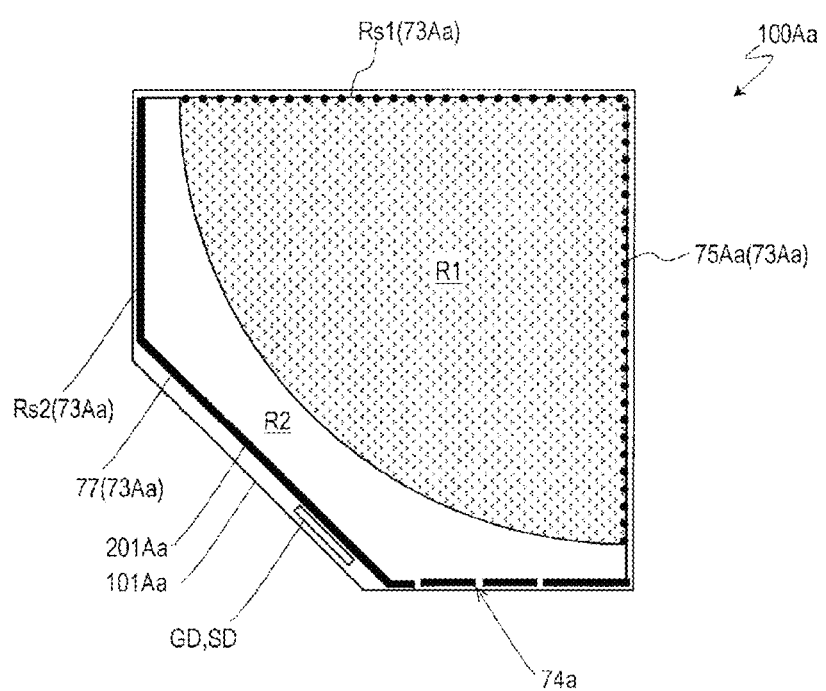
FIG. 6 is a schematic plan view of a liquid crystal panel 100Aa included in a scanning antenna according to a first embodiment of the disclosure.
Figure 7:
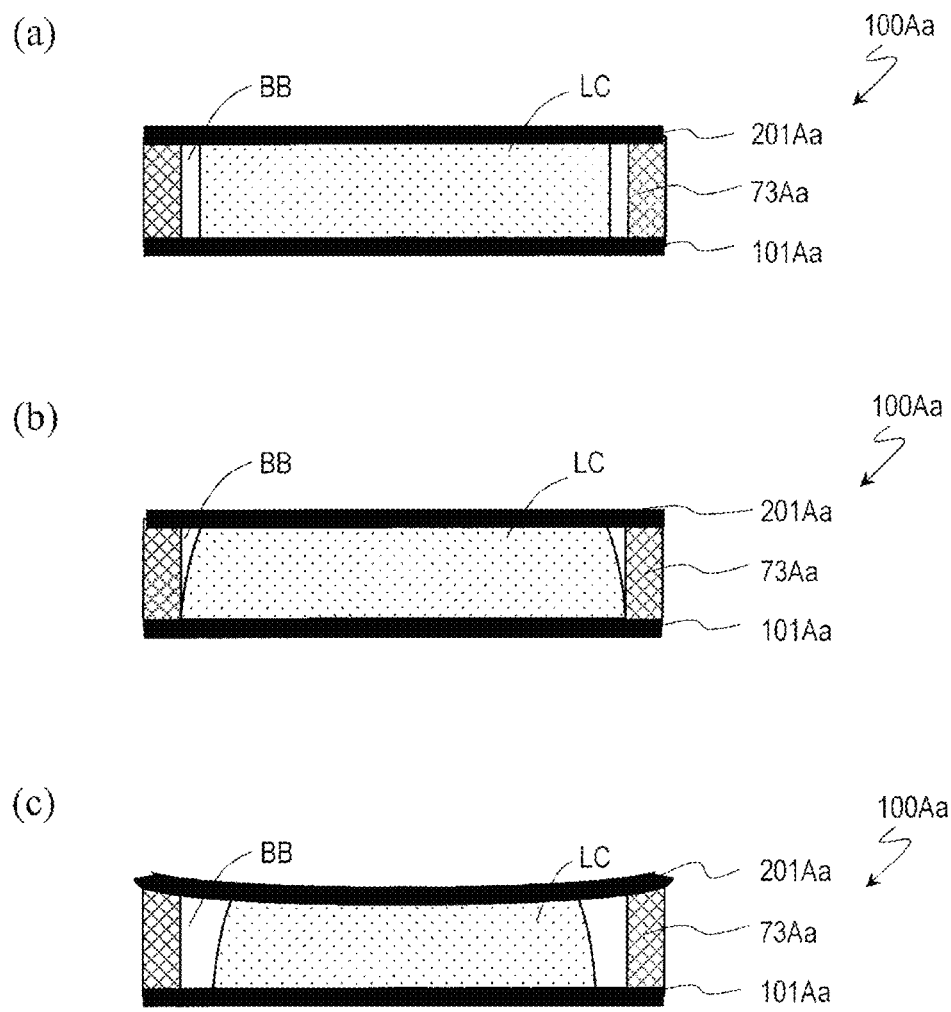
FIGS. 7(a) to 7(c) are schematic cross-sectional views of the liquid crystal panel 100Aa.

FIG. 6 is a schematic plan view of one liquid crystal panel 100Aa for preparing a liquid crystal panel of the scanning antenna according to a first embodiment of the disclosure by tiling four liquid crystal panels. FIGS. 7(a) to 7(c) are schematic cross-sectional views of the liquid crystal panel 100Aa. FIG. 7(a) illustrates a state immediately after the liquid crystal layer LC is formed (at a room temperature (for example, 25° C.)). FIG. 7(b) illustrates a state in which the volume of liquid crystal material increases (for example, due to increase in the temperature) from the state in FIG. 7(a), and FIG. 7(c) illustrates a state in which the volume of liquid crystal material decreases (for example, due to decrease in the temperature) from the state in FIG. 7(a). Common reference numerals may be assigned to the configuration common to the scanning antenna 1000, and descriptions thereof may be omitted. In the following, an example is described in which the scanning antenna divided into four is prepared, but the embodiment of the disclosure are not limited thereto.

As illustrated in FIG. 7(a), in the liquid crystal panel 100Aa, a vacuum bubble (vacuum region) is intentionally generated in the liquid crystal layer LC in the process for forming the liquid crystal layer LC. The liquid crystal layer LC refers to a region between a TFT substrate 101Aa and a slot substrate 201Aa, and surrounded by a seal portion 73Aa. This configuration can prevent an increase in the thickness of the liquid crystal layer at a high temperature, and thus, the reduction in the antenna performance can be suppressed.

In the process for forming the liquid crystal layer LC, a vacuum bubble (vacuum region) BB can be formed in the liquid crystal layer LC by adjusting the supply amount of liquid crystal material. In the liquid crystal panel 100Aa, even in a case where the volume of liquid crystal material changes, the change in the thickness of the liquid crystal layer LC is suppressed due to the vacuum bubble BB absorbing the change in the volume of liquid crystal material, as illustrated in FIG. 7(b) and FIG. 7(c). In other words, the deflection of the dielectric substrate (for example, the glass substrate) included in the TFT substrate 101Aa and/or the slot substrate 201Aa is also suppressed. In a case where the liquid crystal material expands, the volume of vacuum bubble BB decreases, and in a case where the liquid crystal material shrinks, the volume of vacuum bubble BB increases. In particular, in a case where the liquid crystal material thermally expands, the deformation (deflection) of the TFT substrate 101Aa and the slot substrate 201Aa can be avoided as long as the vacuum bubble BB remains, as illustrated in FIG. 7(b), so the thickness of the liquid crystal layer LC can be thought to not change as long as the vacuum bubble BB remains.

Furthermore, the liquid crystal panel 100Aa has the structure illustrated in FIG. 6, and thus, the following effects are also obtained. In a case where the liquid crystal material thermally shrinks, it is possible to suppress the generation of a vacuum bubble (low-temperature air bubble) around the columnar spacer in the transmission and/or reception region R1. Moreover, a position of the vacuum bubble (vacuum region) generated in the process for forming the liquid crystal layer LC can also be controlled. Thus, the reduction in the antenna performance caused by the vacuum bubble can be suppressed.

As illustrated in FIG. 6, the seal portion 73Aa of the liquid crystal panel 100Aa includes a wide gap portion 77 in the non-transmission and/or reception region R2, the wide gap portion 77 being a gap partially wide between the first dielectric substrate 1 and the second dielectric substrate 51. Specifically, the gap between the first dielectric substrate 1 and the second dielectric substrate 51 in the wide gap portion 77 is larger than the gap between the first dielectric substrate 1 and the second dielectric substrate 51 in a portion other than the wide gap portion 77 of the seal portion 73Aa. The gap between the first dielectric substrate 1 and the second dielectric substrate 51 in the wide gap portion 77 is larger than the gap between the first dielectric substrate 1 and the second dielectric substrate 51 in the transmission and/or reception region R1. For example, the portion other than the wide gap portion 77 of the seal portion 73Aa includes a first granular spacer that defines the thickness of the liquid crystal layer LC in the transmission and/or reception region R1, and the wide gap portion 77 includes a second granular spacer having a particle diameter greater than that of the first granular spacer. In FIG. 6, the wide gap portion 77 is a portion of the seal portion 73Aa indicated by a thick line. In FIG. 6, a seal portion Rs1 of the seal portion 73Aa provided in the transmission and/or reception region R1 is indicated by a dotted line. The wide gap portion 77 is provided in a seal portion Rs2 provided in the non-transmission and/or reception region R2. As illustrated in FIG. 3(a), the liquid crystal panel 100Aa is a quarter panel for forming a single scanning antenna by a tiling. Here, a boundary line between the transmission and/or reception region R1 and the non-transmission and/or reception region R2 can be, for example, a line including a point that is 2 mm or more away from the outermost antenna unit. Note that, as in the example illustrated in FIG. 3(c), for example, in a case where the liquid crystal panel of the scanning antenna is formed without being divided, the entire seal portion (seal region) may be provided in the non-transmission and/or reception region R2. In such a case, the entire seal portion may also serve as a wide gap.

As described above, when a vacuum bubble is generated in the liquid crystal layer LC (in particular, the liquid crystal layer LC in the vicinity of the patch electrode 15 and the slot 57) in the transmission and/or reception region R1, the antenna performance is likely to be affected by the change in the electrostatic capacitance value of the liquid crystal capacitance. In the case where the liquid crystal material thermally shrink, the columnar spacer does not follow the decrease in the volume of liquid crystal material due to thermal shrinkage, and thus, a vacuum bubble (low-temperature air bubble) may be generated around the columnar spacer. In a case where the liquid crystal panel has spacers defining different cell gaps, the low-temperature air bubble upon the temperature decreasing is first generated around the spacer defining the largest cell gap. Therefore, for example, in a case where the cell gap defined by the columnar spacer in the transmission and/or reception region R1 is the same as or larger than the cell gap defined by the seal portion, a low-temperature air bubble may be generated around the columnar spacer in the transmission and/or reception region R1. In the liquid crystal panel 100Aa, since the gap between the first dielectric substrate 1 and the second dielectric substrate 51 in the wide gap portion 77 is larger than the gap between the first dielectric substrate 1 and the second dielectric substrate 51 in the transmission and/or reception region R1, a low-temperature air bubble can be preferentially generated around the wide gap portion 77, and the generation of a vacuum bubble around the columnar spacer in the transmission and/or reception region R1 can be suppressed. Thus, the reduction in the antenna performance is suppressed.

By selecting the position of the wide gap portion 77 in the seal portion 73Aa, the low-temperature bubble can be controlled to be formed in the non-transmission and/or reception region R2 at a location remote from the transmission and/or reception region R1. In a case where the wide gap portion 77 is formed in the seal portion 73Aa, the seal portion Rs2 provided in the non-transmission and/or reception region R2 preferably includes a point that is 2 mm or more away from the transmission and/or reception region R1.

By selecting the position of the wide gap portion 77 in the seal portion 73Aa, the position of the vacuum bubble (vacuum region) generated in the process for forming the liquid crystal layer LC can also be controlled. This is because in the process for forming the liquid crystal layer LC, the vacuum bubble (vacuum region) tends to be easily formed along the wide gap portion 77. Thus, the reduction in the antenna performance can be suppressed also at a room temperature, for example.

In this way, in the scanning antenna having the liquid crystal panel 100Aa, the reduction in the antenna performance can be suppressed at from a high temperature to low temperature (including the cases that the liquid crystal material thermally expands and shrinks). Without limitation on the illustrated examples, a scanning antenna as follows may generally obtain this effect; (1) in the process for forming a liquid crystal layer, a vacuum bubble (vacuum region) is formed in the liquid crystal layer (that is a region between the TFT substrate and the slot substrate, and surrounded by the seal portion); and (2) a spacer structure is included in the seal portion or in a region surrounded by the seal portion in the non-transmission and/or reception region R2, the spacer structure defining a gap between the first dielectric substrate 1 and the second dielectric substrate 51 larger than a gap between the first dielectric substrate 1 and the second dielectric substrate 51 in the transmission and/or reception region R1 (also called as a "first gap"). Herein, the "spacer structure" includes all of the conductive layers, insulating layers, and spacers (columnar spacers or granular spacers) included between the first dielectric substrate 1 and the second dielectric substrate 51. A spacer that defines the first gap disposed in the transmission and/or reception region R1 may be referred to as a first spacer structure. The first spacer structure includes a columnar spacer. The first spacer structure typically includes a columnar spacer defining the thickness of the liquid crystal layer LC between the patch electrode 15 and the slot electrode 55. The scanning antenna according to the embodiment of the disclosure may include a second spacer structure in the non-transmission and/or reception region R2 in the region surrounded by the seal portion, the second spacer structure being higher than the first spacer structure. Assuming that a height of the first spacer structure defining the first gap is 1, a height of the second spacer structure is preferably 1.1 or more and 2.0 or less, for example. A difference between the height of the first spacer structure and the height of the second spacer structure is, for example, 0.9 μm or more 3 μm or less. The second spacer structure being too high compared to the first spacer structure may affect the thickness of the liquid crystal layer LC in the transmission and/or reception region R1.

The method of making the second spacer structure higher than the first spacer structure may be optional. For example, the particle diameter of the granular spacer or the height of the columnar spacer may be varied. For example, the second spacer structure may include a spacer that is higher than the columnar spacer included in the first spacer structure (e.g., the columnar spacer defining the thickness of the liquid crystal layer LC between the patch electrode 15 and the slot electrode 55). Alternatively, a layered structure of the conductive layer and the insulating layer included in the TFT substrate and the slot substrate may be varied between the first spacer structure and the second spacer structure. For example, by patterning the conductive layer, the first spacer structure may not include the conductive layer and the second spacer structure may include the conductive layer. Alternatively, by forming an opening in the insulating layer, the first spacer structure may not include the insulating layer, and the second spacer structure may include the insulating layer. Alternatively, the thickness of any of the conductive layer and the insulating layer included in the TFT substrate and the slot substrate may be varied between the first spacer structure and the second spacer structure. Of course, some of the above configurations may be combined.

The liquid crystal layer may be formed by vacuum injection or may be formed by one drop filling. In the case where the vacuum injection is used, for example, the supply of the liquid crystal material may be stopped in a state in which a vacuum region is present between the TFT substrate and the slot substrate, and in the region surrounded by the seal portion. In a case where the one drop filling is used, for example, an amount of liquid crystal material smaller than a volume required to fill the entire region surrounded by the seal portion may be added dropwise.

In the process for forming the liquid crystal layer, a vacuum bubble (vacuum region) is preferably generated in the liquid crystal layer LC in the non-transmission and/or reception region R2. As described above, in the process for forming the liquid crystal layer LC, the vacuum bubble (vacuum region) tend to be easily formed along the wide gap portion 77, so the wide gap portion 77 is preferably disposed at a position remote from the transmission and/or reception region R1. After the liquid crystal material is injected, the temperature of the liquid crystal layer may be increased to, for example, 120° C. or higher (or, for example, a Tni point or higher), and thereafter, decreased to control the position of the vacuum bubble (vacuum region) formed in the liquid crystal layer. In this case, the position of the vacuum bubble can be controlled with higher accuracy. In other words, in a case where the liquid crystal layer is heated, as the volume of liquid crystal material increases, the volume of vacuum bubble (vacuum region) is reduced, as described above. For example, in a case where the temperature of the liquid crystal layer is increased to such an extent that the vacuum bubble (vacuum region) disappears, and thereafter, the temperature is decreased, the vacuum bubble begins to be generated from around the spacer defining the largest cell gap as described above. Specifically, the vacuum bubble is mainly formed around the wide gap portion 77. Additionally, by providing an additional seal portion described later, it is possible to control the liquid crystal layer in the non-transmission and/or reception region R2 with higher accuracy so that the vacuum bubble (vacuum regions) is readily generated. In the case where the one drop filling is used, the liquid crystal material may be preferentially added dropwise to the transmission and/or reception region R1.

In LCD panels, a region serving as a display region is filled with a liquid crystal material without deficiency or excess, and a partition may be formed inside the seal portion in order to suppress the generation of a vacuum bubble and variations in the thickness of the liquid crystal layer in the display region (see JP 2004-78142 A and JP 03-215828 A, for example). The partition is formed of a sealing member and has a slit. The partition delimits the display region and the buffer region, and the liquid crystal material in the display region may flow through the slit to the buffer region. In the LCD panel described in JP 2004-78142 A, a gap between substrates in the buffer region is larger than a gap between substrates in the display region. This may allow a vacuum bubble to easily move to the buffer region according to the above description. In the LCD described in JP 03-215828 A, a spacer is not provided in the buffer region (spare chamber). This may allow a decrease in a volume of liquid crystal material due to thermal shrinkage to be compensated by liquid crystal material filled into the buffer region according to the above description.

In contrast, the scanning antenna including the liquid crystal panel 100Aa can suppress the reduction in the antenna performance by providing the wide gap portion 77 on the seal portion 73Aa, as described above. There is an advantage that the reduction in the antenna performance can be suppressed without providing the partitions using a new sealing member, and therefore, the increase in the manufacturing cost and manufacturing process can be suppressed. For example, the portion other than the wide gap portion 77 of the seal portion 73Aa may be provided with the first granular spacer that defines the thickness of the liquid crystal layer LC in the transmission and/or reception region R1, and the wide gap portion 77 may be provided with the second granular spacer having the particle diameter greater than that of the first granular spacer. In this case, the spacer structure included in the wide gap portion 77 (sometimes referred to as the second spacer structure) includes the second granular spacer.

FIGS. 8(a) to 8(d) illustrate schematic plan views of liquid crystal panels 100Aa1 to 100Aa4 of a modification example of the liquid crystal panel 100Aa, respectively. The liquid crystal panels 100Aa1 to 100Aa4 include additional seal portions 76A to 76D, respectively, (sometimes collectively referred to as an "additional seal portion 76") instead of the wide gap portion 77. The additional seal portion 76 defines a gap, wider than the first gap, between the first dielectric substrate 1 and the second dielectric substrate 51. Since the liquid crystal panels 100Aa1 to 100Aa4 include the additional seal portion 76 in the non-transmission and/or reception region R2 in a region surrounded by the seal portion 73Aa, the position of the region in which the vacuum bubble (vacuum region) is generated can be controlled with higher accuracy in the process of forming the liquid crystal layer.

As illustrated in FIGS. 8(a) to 8(d), the region surrounded by the seal portion 73Aa is preferably divided by the additional seal portion 76 into an active region Ra including the transmission and/or reception region R1 and a buffer region Rb other than the active region Ra. However, the liquid crystal material is not completely blocked between the active region Ra and the buffer region Rb and the liquid crystal material may move between the active region Ra and the buffer region Rb. The additional seal portion 76 is preferably remote from the transmission and/or reception region R1. This is because a low temperature bubble is easily generated around the additional seal portion 76 for reasons similar to the above-described wide gap portion 77.

Figure 8:
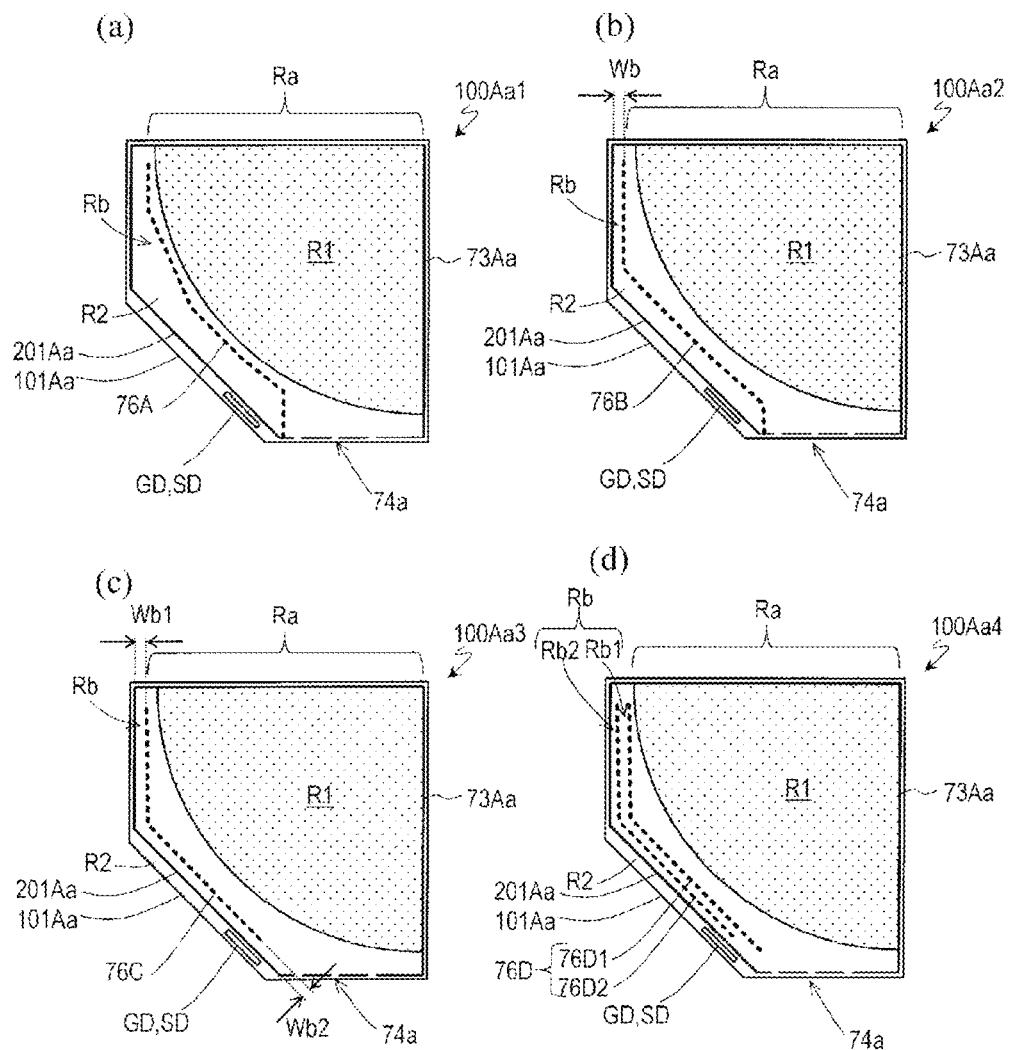
FIGS. 8(a) to 8(d) are schematic plan views of liquid crystal panels 100Aa1 to 100Aa4 of a modification example of the liquid crystal panel 100Aa, respectively.

For example, as illustrated in FIGS. 8(a) and 8(b), the additional seal portions 76A and 76B are formed so that the liquid crystal material injected from the injection port 74a is filled into the buffer region Rb through the active region Ra. Such an additional seal portion being included allows easy control of the volume of vacuum bubble (vacuum region) generated in the process for forming the liquid crystal layer LC. In particular, by reducing a width Wb of an inlet of the buffer region Rb as in the additional seal portion 76B illustrated in FIG. 8(b), a rate at which the liquid crystal material is filled into the buffer region Rb can be reduced. As a result, the volume of vacuum bubble (vacuum region) in the liquid crystal layer LC is easily controlled. For example, even in a case where there is variation in the liquid crystal injection rate between liquid crystal panels and/or between lots, the volume can be easily controlled. As illustrated in FIG. 8(b), the buffer region Rb is more preferably formed so that a region where the width Wb is smaller continues long. The width Wb is, for example, about 5 mm to 15 mm, and is about 10 mm, for example. A length of the region where the width Wb is substantially constant may be about 5 mm to 50 mm, for example.

By further providing a resin structure (not illustrated) near the inlet of the buffer region, the rate at which the liquid crystal material is filled into the buffer region Rb can be further reduced. The resin structure can be formed by a photolithography process using, for example, an ultraviolet-curing resin. The resin structure can be formed in the same process as the columnar spacers provided in the transmission and/or reception region, for example. A bottom surface area of the resin structure may be the same as that of the columnar spacer, for example.

Alternatively, as illustrated in FIG. 8(c), the additional seal portion 76C may be formed so that the liquid crystal material is filled from two inlets into the buffer region Rb. The widths Wb1 and Wb2 of the two inlets may be the same or different, and are about 5 mm to 15 mm independently from each other, for example.

As illustrated in FIG. 8(d), two buffer regions Rb1 and Rb2 may be formed by two additional seal portions 76D1 and 76D2. The respective buffer regions may have widths of inlets and lengths of regions where the widths are substantially constant that are within the aforementioned preferable ranges independently from each other.

In a case where the seal portion 73Aa includes, for example, the first granular spacer that defines the thickness of the liquid crystal layer LC in the transmission and/or reception region R1, the additional seal portion 76 includes a granular spacer having a particle diameter greater than the first granular spacer (for example, the particle diameter is 3.5 μm to 10 μm and, for example, the particle diameter is 4 μm). In this case, the spacer structure included in the additional seal portion 76 includes a granular spacer. Note that the spacer structure included in the additional seal portion 76 may have a columnar spacer instead of a granular spacer.

Figure 9:
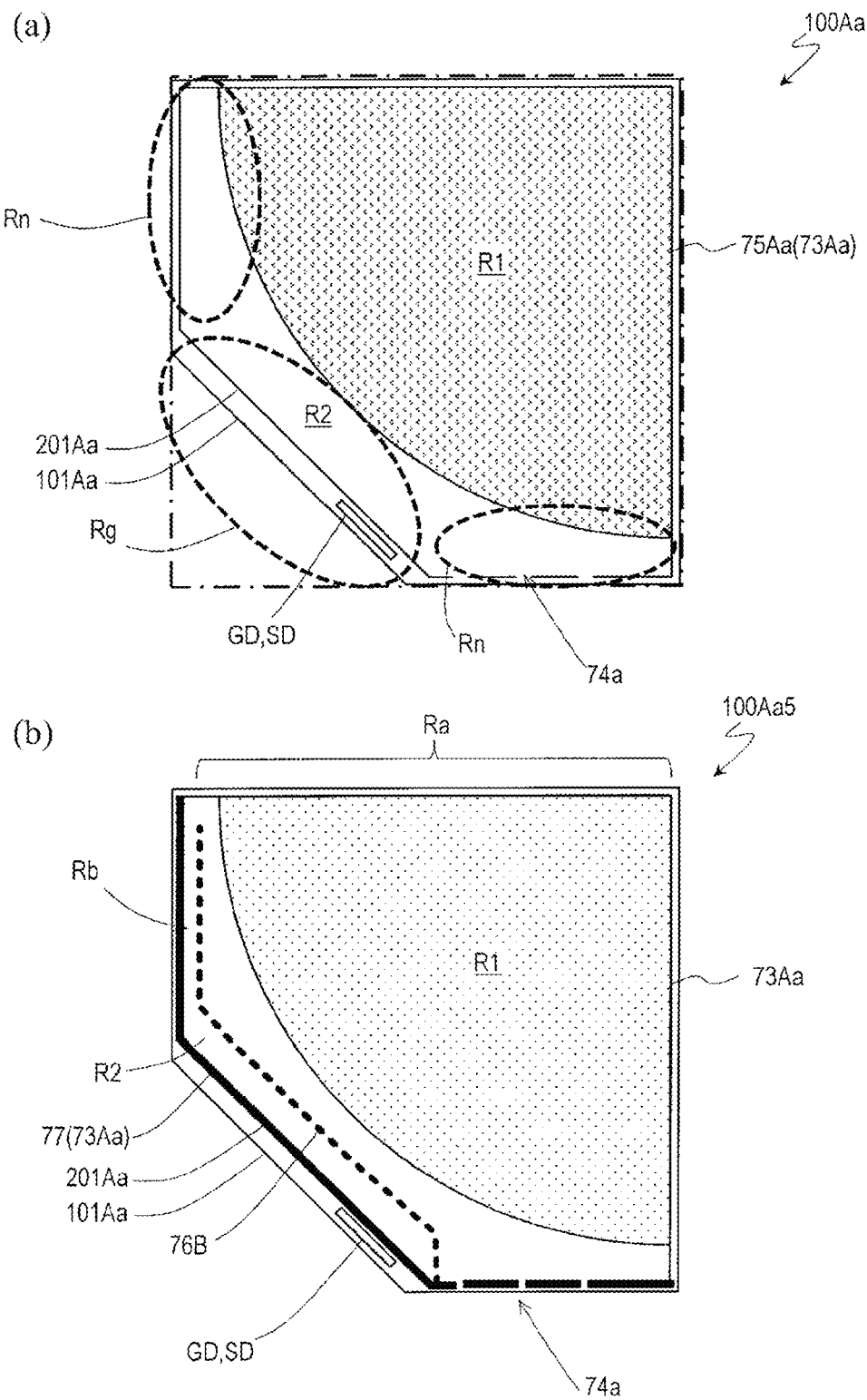
FIG. 9(a) is a schematic plan view for illustrating a position at which an additional seal portion 76 is formed.
FIG. 9(b) is a schematic plan view of a liquid crystal panel 100Aa5 of a modification example of the liquid crystal panel 100Aa.

The position at which the additional seal portion 76 is formed is preferably in a region Rg illustrated in FIG. 9(a) among the non-transmission and/or reception regions R2 in the region surrounded by the seal portion 73Aa. The dielectric substrate 1 included in the TFT substrate 101Aa and the dielectric substrate 51 included in the slot substrate 201Aa are typically glass substrates, and are formed by cutting a rectangular (including square and rectangular) mother glass substrate into a desired shape. An example of the shape of the mother glass substrate is indicated by a dot-dash line in FIG. 9(a). As can be seen from FIG. 9(a), even in a case where the region Rg is widened, a size of the mother glass substrate and a size of the transmission and/or reception region included in the liquid crystal panel prepared from the mother glass substrate are less affected. In contrast, in a case where a region Rn is widened, the mother glass substrate is required to be made larger or the transmission and/or reception region included in the liquid crystal panel prepared from the mother glass substrate is required to be made smaller, which may increase the manufacturing costs. Therefore, assuming, when viewed from a normal direction of the dielectric substrate 1, the smallest rectangle containing the liquid crystal panel, the additional seal portion 76 preferably includes a portion formed in a region along a side where a notch from the rectangle is the largest. Alternatively, assuming, when viewed from the normal direction of the dielectric substrate 1, a distance to an edge of the liquid crystal panel 100Aa in the normal direction at each point on an edge of the transmission and/or reception region R1, the additional seal portion 76 is preferably formed in a region including a portion where the distance is the longest. Note that a plurality of TFT substrates or slot substrates may be formed from one mother glass substrate.

The shape and disposition position of the additional seal portion are not limited to those illustrated. It is preferable to appropriately adjust the shape and disposition position of the additional seal portion and the volume of vacuum bubble (vacuum region) generated in the process for forming the liquid crystal layer LC by the characteristics of the liquid crystal material, the environment temperature of the scanning antenna, and the like. In a case where the volume of vacuum bubble (vacuum region) generated in the process for forming the liquid crystal layer LC is large, the effect of suppressing the change in the thickness of the liquid crystal layer due to the change in the volume of liquid crystal material (particularly during thermal expansion) is increased, but on the other hand, the vacuum bubble (vacuum region) is also increasingly likely to be generated in the transmission and/or reception region RE The vacuum region generated in the process for forming the liquid crystal layer LC is about 5% to 20% of the area of the region surrounded by the seal portion 73Aa when viewed from the normal direction of the dielectric substrate 1 or 51, for example. The volume of vacuum bubble (vacuum region) generated in the process for forming the liquid crystal layer LC may be adjusted so that the vacuum region disappears when the temperature reaches a high temperature (for example, 120° C. or higher). This temperature may be determined taking into account, for example, the temperature of the environment where the scanning antenna may be installed (for example, 20° C. to 70° C.), the Tni point of the liquid crystal material, the temperature which the liquid crystal material reaches in the manufacturing process (for example, heat treatment), and the like.

It is conceived that as the spacer structure included in the additional seal portion 76 is increased (for example, as the particle diameter of the spacer structure included in the additional seal portion 76 is increased), the volume of vacuum bubble (vacuum region) formed increases. In order to suppress the formation of vacuum bubble (vacuum region) in the transmission and/or reception region R1, it is preferable to appropriately adjust a distance between the additional seal portion 76 and the transmission and/or reception region R1. It is also preferable to appropriately adjust a height of the spacer structure included in the additional seal portion 76. A difference between the height of the spacer structure included in the additional seal portion 76 and the height of the spacer structure provided in the transmission and/or reception region R1 is 500 nm to 5000 nm, for example.

The additional seal portion is not limited to those dividing the region surrounded by the seal portion into an active region and a buffer region other than the active region. For example, a plurality of resin structures described above may be arranged. When viewed from the normal direction of the dielectric substrate 1 or 51, the additional seal portion may have a dot shape.

FIGS. 8(a) to 8(d) illustrate the modification examples having the additional seal portion 76 instead of the wide gap, but the liquid crystal panel according to the embodiment of the disclosure may include the additional seal portion 76 described above in addition to the wide gap portion.

FIG. 9(b) schematically illustrates a liquid crystal panel 100Aa5 of another modification example. The liquid crystal panel 100Aa5 includes the wide gap portion 77 and the additional seal portion 76B. Since the wide gap portion 77 defines the gap, wider than the first gap, between the first dielectric substrate 1 and the second dielectric substrate 51, a gap between the first dielectric substrate 1 and the second dielectric substrate 51 defined by the additional seal portion 76B may be the same as or larger than the first gap. Moreover, the gap between the first dielectric substrate 1 and the second dielectric substrate 51 defined by the additional seal portion 76B may be larger or smaller than the gap between the first dielectric substrate 1 and the second dielectric substrate 51 defined by the wide gap portion 77.

Manufacturing Method and Structure of TFT Substrate

Figure 10:
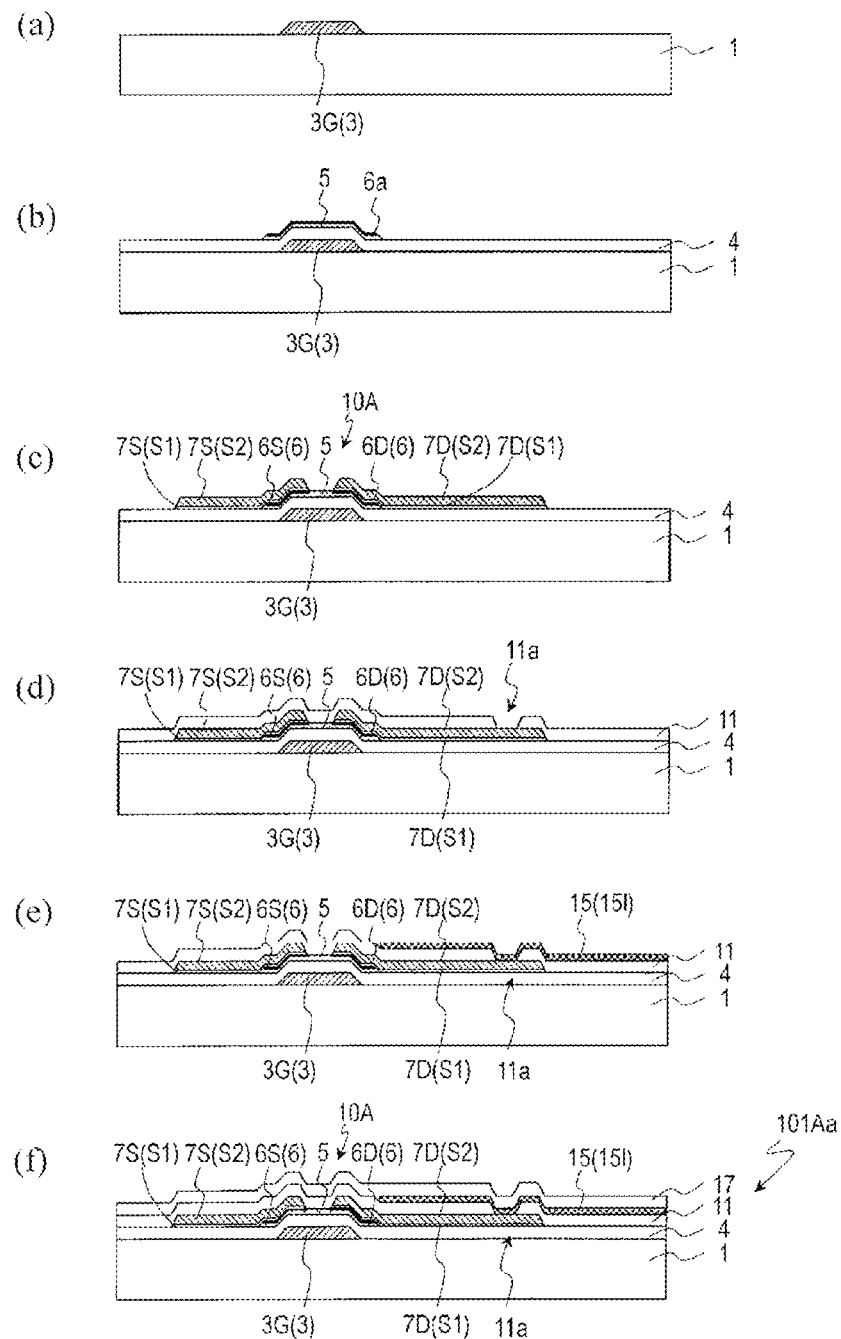
FIGS. 10(a) to 10(e) are schematic cross-sectional views for illustrating a method for manufacturing a TFT substrate 101Aa included in the scanning antenna according to the first embodiment of the disclosure.
FIG. 10(f) is a schematic cross-sectional view illustrating the TFT substrate 101Aa.

Referring to FIG. 10, a structure and manufacturing method of the TFT substrate 101Aa will be described. FIGS. 10(a) to 10(e) are schematic cross-sectional views for illustrating the method for manufacturing the TFT substrate 101Aa, and FIG. 10(f) is a schematic cross-sectional view illustrating the TFT substrate 101Aa.

Note that the structure and manufacturing method of the TFT substrate included in the scanning antenna according to the embodiment of the disclosure is not limited to those illustrated.

The TFT substrate 101Aa illustrated in FIG. 10(f) includes the dielectric substrate 1 and a plurality of antenna unit regions U arranged on the dielectric substrate 1. Each of the antenna unit regions U includes a TFT 10A and a patch electrode 15 electrically connected to a drain electrode 7D of the TFT 10A.

The TFT substrate 101Aa includes a gate metal layer 3 supported by the dielectric substrate 1, a gate insulating layer 4 formed on the gate metal layer 3, a source metal layer 7 formed on the gate insulating layer 4, a first insulating layer 11 formed on the source metal layer 7, a patch metal layer 151 formed on the first insulating layer 11, and a second insulating layer 17 formed on the patch metal layer 151, as illustrated in FIG. 10(f). Here, the source metal layer 7 includes a lower layer S1 and an upper layer S2 formed on the lower layer S1. Here, the TFT substrate 101Aa further includes an upper conductive layer 19 formed on the second insulating layer 17, as in a structure of the non-transmission and/or reception region R2 (transfer section) illustrated in FIG. 12 described below.

The TFT 10A included in each antenna unit region U includes a gate electrode 3G, an island-shaped semiconductor layer 5, contact layers 6S and 6D, the gate insulating layer 4 disposed between the gate electrode 3G and the semiconductor layer 5, and a source electrode 7S and the drain electrode 7D. In this example, the TFT 10A is a channel etched type TFT having a bottom gate structure.

The gate electrode 3G is electrically connected to the gate bus line, and a scanning signal is supplied via the gate bus line. The source electrode 7S is electrically connected to the source bus line, and a data signal is supplied via the source bus line. The gate electrode 3G and the gate bus line may be formed of the same conductive film (gate conductive film). The source electrode 7S, the drain electrode 7D, and the source bus line may be formed of the same conductive film (source conductive film). The gate conductive film and the source conductive film are, for example, metal films. Herein, layers formed using a gate conductive film may be referred to as "gate metal layers," and layers formed using a source conductive film may be referred to as "source metal layers." A layer formed of a patch conductive film and including the patch electrode 15 may be referred to as a "patch metal layer."

The semiconductor layer 5 is disposed overlapping the gate electrode 3G with the gate insulating layer 4 interposed therebetween. In the illustrated example, a source contact layer 6S and a drain contact layer 6D are formed on the semiconductor layer 5. The source contact layer 6S and the drain contact layer 6D are disposed on both sides of a region where a channel is formed in the semiconductor layer 5 (channel region). In this example, the semiconductor layer 5 may be an intrinsic amorphous silicon (i-a-Si) layer, and the source contact layer 6S and the drain contact layer 6D may be n+ type amorphous silicon (n$^+$-a-Si) layers.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

The first insulating layer 11 includes an opening 11a that at least reaches the drain electrode 7D of the TFT 10A.

The patch electrode 15 is provided on the first insulating layer 11 and within the opening 11a, and is in contact with the drain electrode 7D in the opening 11a. The patch electrode 15 includes a metal layer. The patch electrode 15 may be a metal electrode formed only from a metal layer. The patch electrode 15 may include a Cu layer or an Al layer as a main layer. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer.

Each antenna unit region U may have an auxiliary capacity electrically connected in parallel with the liquid crystal capacitance. The auxiliary capacity includes, for example, an upper auxiliary capacitance electrode electrically connected to the drain electrode 7D, the gate insulating layer 4, and a lower auxiliary capacitance electrode opposite to the upper auxiliary capacitance electrode with the gate insulating layer 4 interposed therebetween. For example, the lower auxiliary capacitance electrode is included in the gate metal layer 3 and the upper auxiliary capacitance electrode is included in the source metal layer 7. The gate metal layer 3 may further include a CS bus line (auxiliary capacitance line) connected to the lower auxiliary capacitance electrode.

Figure 12:
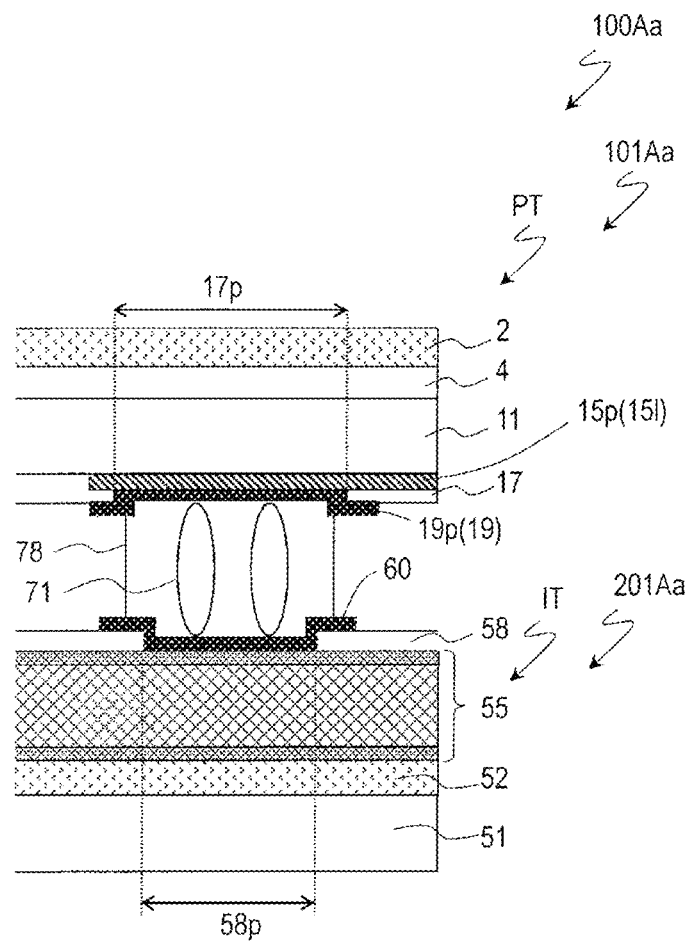
FIG. 12 is a cross-sectional view schematically illustrating a structure of a transfer section included in the TFT substrate 101Aa and the slot substrate 201Aa.

FIG. 12 is a cross-sectional view schematically illustrating a structure of a transfer section included in the TFT substrate 101Aa and the slot substrate 201Aa. A structure of a transfer terminal section PT of the TFT substrate 101Aa will be described with reference to FIG. 12.

As illustrated in FIG. 12, the transfer terminal section PT include a patch connection section 15p formed on the first insulating layer 11, the second insulating layer 17 covering the patch connection section 15p, and a transfer terminal upper connection section 19p. The transfer terminal upper connection section 19p is in contact with the patch connection section 15p within an opening 17p formed in the second insulating layer 17. The patch connection section 15p is included in the patch metal layer 151. The transfer terminal upper connection section 19p (also simply referred to as an "upper connection section 19p") is included in the upper conductive layer 19 formed on the second insulating layer 17, here.

A description is given of a manufacturing method of the TFT substrate 101Aa with reference to FIGS. 10(a) to 10(e).

First, the gate metal layer 3 including the gate electrode 3G is formed on the dielectric substrate 1 as illustrated in FIG. 10(a).

The gate electrode 3G can be formed integrally with the gate bus line. Here, a not-illustrated gate conductive film is formed on the dielectric substrate 1 by sputtering or the like. Next, the gate conductive film is patterned to obtain the gate electrode 3G. The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, a Cu film (having a thickness of, for example, 200 nm to 500 nm) is used as the gate conductive film. As the gate conductive film, a layered film (Cu/Ti) formed by layering a Ti film (having a thickness of 20 nm to 100 nm, for example) and a Cu film (having a thickness of 200 nm to 500 nm, for example) in this order may be used. By providing the Ti film under the Cu film, adhesion between the dielectric substrate 1 and the gate metal layer 3 can be improved. Here, patterning of the gate conductive film is performed by photolithography, wet etching, and resist peeling and rinse.

Next, the gate insulating layer 4, the semiconductor layer 5 and a contact layer 6a are formed as illustrated in FIG. 10(b).

The gate insulating layer 4 can be formed by CVD or the like. As the gate insulating layer 4, a silicon oxide ($SiO_x$) layer, a silicon nitride ($SiN_x$) layer, a silicon oxynitride ($SiO_xN_y$ (x>y)) layer, a silicon nitride oxide ($SiN_xO_y$ (x>y)) layer, or the like may be used as appropriate. The gate insulating layer 4 may have a layered structure. Here, a $SiN_x$ layer (having a thickness of 100 nm to 500 nm, for example) is formed as the gate insulating layer 4. Next, the semiconductor layer 5 and the contact layer 6a are formed on the gate insulating layer 4. Here, an intrinsic amorphous silicon film (having a thickness of 30 nm to 300 nm, for example) and an n+ type amorphous silicon film (having a thickness of 50 nm to 150 nm, for example) are formed in this order and patterned by photolithography, dry etching, and resist peeling and rinse to obtain the island-shaped semiconductor layer 5 and the contact layer 6a.

Next, a source conductive film is formed on the gate insulating layer 4 and the contact layer 6a, and patterned to form the source metal layer 7 including the source electrode 7S and the drain electrode 7D as illustrated in FIG. 10(c). At this time, the contact layer 6a is also etched, and the source contact layer 6S and the drain contact layer 6D are formed to be separated from each other.

The material of the source conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. Here, as the source conductive film, a layered film (Cu/Ti) is formed by layering a Ti film (having a thickness of 20 nm to 100 nm, for example) and a Cu film (having a thickness of 100 nm to 400 nm, for example) in this order. Here, for example, the source conductive film (Ti film and Cu film) is formed by sputtering, and is subjected to photolithography, etching (the Cu film is wet etched, and then, the Ti film and the contact layer 6a are dry etched), and resist peeling and rinse in this order to obtain the source metal layer 7 including the lower layer S1 and the upper layer S2. At this time, a portion of the contact layer 6a located on a region that will serve as the channel region of the semiconductor layer 5 is removed in the dry etching process to form a gap portion, and obtain the source contact layer 6S and the drain contact layer 6D. At this time, in the gap portion, the vicinity of the surface of the semiconductor layer 5 can also be etched (overetching). In this manner, the TFT 10A is obtained.

Next, as illustrated in FIG. 10(d), the first insulating layer 11 is formed to cover the TFT 10A, and the opening 11a that at least reaches the drain electrode 7D is formed in the first insulating layer 11 by known photolithography and dry etching. In this example, the first insulating layer 11 is disposed so as to be in contact with the channel region of the semiconductor layer 5.

The first insulating layer 11 may be an inorganic insulating layer such as a silicon oxide ($SiO_x$) film, a silicon nitride ($SiN_x$) film, a silicon oxynitride ($SiO_xN_y$ (x>y)) film, or a silicon nitride oxide ($SiN_xO_y$ (x>y)) film, for example. Here, as the first insulating layer 11, a $SiN_x$ film (having a thickness of 100 nm to 500 nm, for example) is formed by CVD.

For example, in a case where the gate insulating layer 4 includes an opening in the non-transmission and/or reception region R2, the opening may be formed in the gate insulating layer 4 in this process. For example, in a case where the lower connection section of the terminal section provided in the non-transmission and/or reception region R2 is formed by the gate metal layer 3, an opening that at least reaches the lower connection section may be formed in the gate insulating layer 4 and the first insulating layer 11. For example, the gate insulating layer 4 and the first insulating layer 11 may be etched collectively by dry etching using a fluorine gas.

Next, a patch conductive film is formed on the first insulating layer 11 and within the opening 11a, and is patterned to form the patch electrode 15 as illustrated in FIG. 10(e). The patch connection section 15p is formed in the transfer terminal section formation region of the non-transmission and/or reception region R2. The patch electrode 15 is in contact with the drain electrode 7D within the opening 11a.

The same material as that of the gate conductive film or the source conductive film can be used as the material of the patch conductive film. The patch conductive film may be configured to be thicker than the gate conductive film and the source conductive film. Accordingly, by reducing the sheet resistance of the patch electrode, the loss resulting from the oscillation of free electrons in the patch electrode changing to heat can be reduced.

Here, a Cu film (having a thickness of 200 nm to 1000 nm, for example) is used as the patch conductive film. As the patch conductive film, a layered film (Cu/Ti) formed by layering a Ti film (having a thickness of 20 nm to 100 nm, for example) and a Cu film (having a thickness of 200 nm to 1000 nm, for example) in this order may be used. By providing the Ti film under the Cu film, adhesion between the first insulating layer 11 and the patch metal layer 151 can be improved. Here, patterning of the patch conductive film is performed by photolithography, wet etching, and resist peeling and rinse.

Next, as illustrated in FIG. 10(f), the second insulating layer 17 is formed on the patch electrode 15 and on the first insulating layer 11. After that, the opening 17p that at least reaches the patch connection section 15p is formed in the second insulating layer 17 by known photolithography and dry etching.

The second insulating layer 17 is not particularly limited to a specific film, and, for example, a silicon oxide ($SiO_x$) film, a silicon nitride ($SiN_x$) film, a silicon oxynitride ($SiO_xN_y$ (x>y)) film, a silicon nitride oxide ($SiN_x O_y$ (x>y)) film, or the like can be used as appropriate. Here, a $SiN_x$ layer (having a thickness of 50 nm to 400 nm) is formed as the second insulating layer 17, for example.

After that, a transparent conductive film (having a thickness of 50 nm to 150 nm, for example) is formed on the second insulating layer 17 and within an opening formed in the second insulating layer 17 by sputtering, for example. An indium tin oxide (ITO) film, an IZO film, a zinc oxide (ZnO) film or the like can be used as the transparent conductive film. The transparent conductive film may have a layered structure including a Ti film (having a thickness of 20 nm to 50 nm, for example), and an ITO film, an IZO film, or a ZnO film in this order. In a case where the transparent conductive film includes a Ti film, corrosion of the patch connection section 15p is suppressed in the transfer terminal section PT, and/or contact resistance between the patch connection section 15p and the upper connection section 19p is reduced.

After that, the transparent conductive film is patterned by photolithography, wet etching, and resist peeling and rinse to obtain the upper conductive layer 19 including the transfer terminal upper connection section 19p. After patterning the transparent conductive film, annealing treatment may be further performed. By performing the annealing treatment on the transparent conductive film, the resistance can be reduced.

In this manner, the TFT substrate 101Aa is obtained.

Here, the antenna unit region of the TFT substrate 101Aa has been illustrated and described. However, TFTs or the like included in the terminal section and the drive circuits (gate driver, source driver, and the like) provided in the non-transmission and/or reception region R2 may also be formed simultaneously with the antenna unit region in the above-described process.

Manufacturing Method and Structure of Slot Substrate

Figure 11:
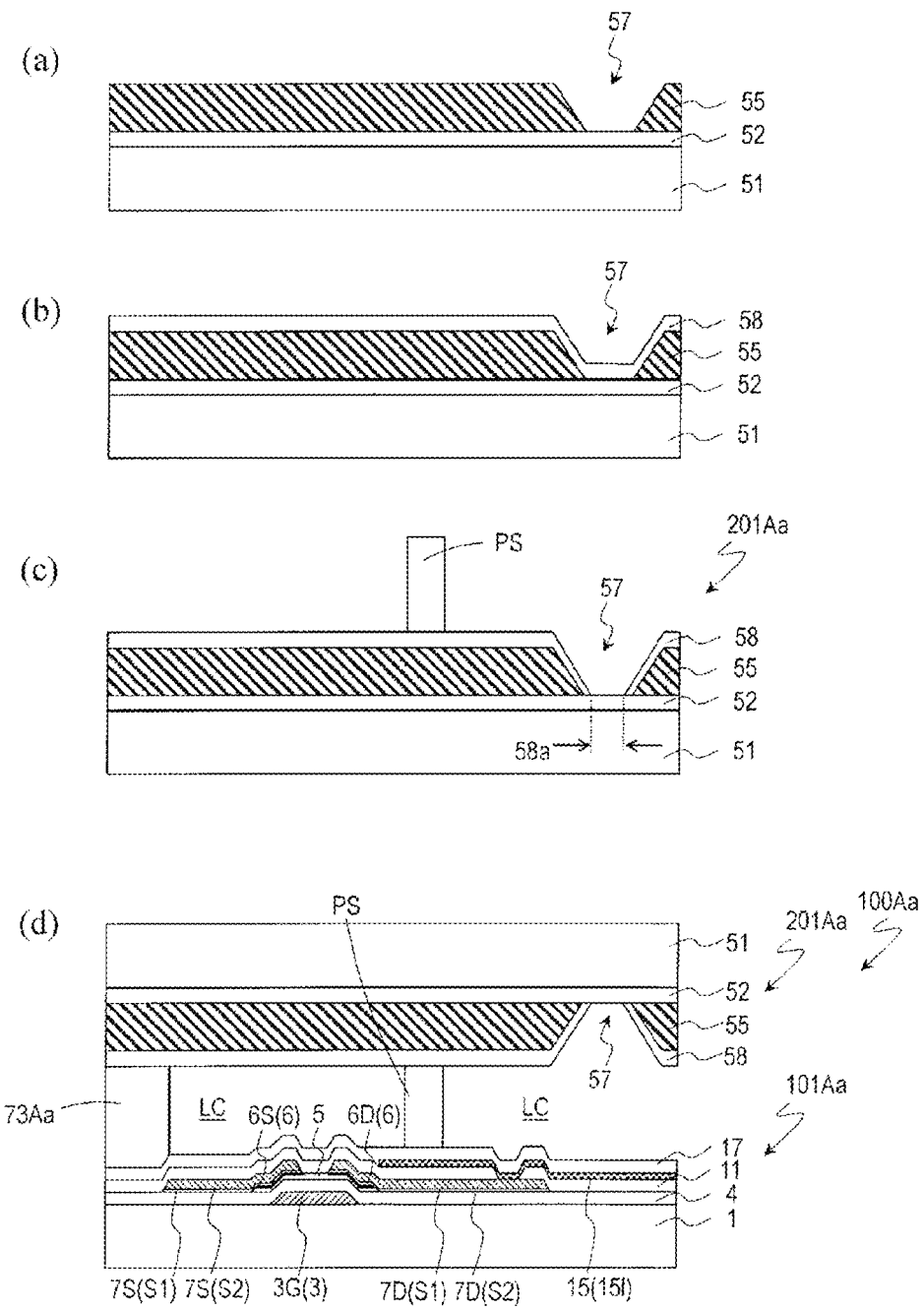
FIGS. 11(a) and 11(b) are schematic cross-sectional views for illustrating a method for manufacturing a slot substrate 201Aa included in the scanning antenna according to the first embodiment of the disclosure.
FIG. 11(c) is a cross-sectional view schematically illustrating an antenna unit region U and a seal portion 73Aa in the slot substrate 201Aa.
FIG. 11(d) is a cross-sectional view schematically illustrating the antenna unit region U and the seal portion 73Aa in the liquid crystal panel 100Aa.

Referring to FIG. 11, a structure and manufacturing method of the slot substrate 201Aa will be described.

FIGS. 11(a) and 11(b) are schematic cross-sectional views for illustrating a method for manufacturing a slot substrate 201Aa, and FIG. 11(c) is a cross-sectional view schematically illustrating the antenna unit region U and the seal portion 73Aa in the slot substrate 201Aa. FIG. 11(d) is a cross-sectional view schematically illustrating the antenna unit region U and the seal portion 73Aa in the liquid crystal panel 100Aa.

As illustrated in FIGS. 11(c) and 11(d), the slot substrate 201Aa includes the dielectric substrate 51 including a front face and a rear face, a third insulating layer 52 formed on the front face of the dielectric substrate 51, the slot electrode 55 formed on the third insulating layer 52, and a fourth insulating layer 58 covering the slot electrode 55. The reflective conductive plate 65 (see FIG. 1) is disposed opposing the rear face of the dielectric substrate 51 with the dielectric layer (air layer) 54 interposed therebetween. The slot electrode 55 and the reflective conductive plate 65 function as walls of the waveguide 301.

In the transmission and/or reception region R1, a plurality of slots 57 are formed in the slot electrode 55. The slot 57 is an opening that opens through the slot electrode 55. In this example, one slot 57 is disposed in each antenna unit region U.

The fourth insulating layer 58 is formed on the slot electrode 55 and within the slot 57. The fourth insulating layer 58 includes, for example, an opening 58a that at least reaches the third insulating layer 52 in the slot 57. The material of the fourth insulating layer 58 may be the same as the material of the third insulating layer 52. By covering the slot electrode 55 with the fourth insulating layer 58, the slot electrode 55 and the liquid crystal layer LC are not in direct contact with each other, such that the reliability can be enhanced. In a case where the slot electrode 55 is formed of a Cu layer, Cu may elute into the liquid crystal layer LC in some cases. In addition, in a case where the slot electrode 55 is formed of an Al layer by using a thin film deposition technique, the Al layer may include a void. The fourth insulating layer 58 can prevent the liquid crystal material from entering the void of the Al layer. Note that in a case where the slot electrode 55 is preparing by bonding an aluminum foil to the dielectric substrate 51 with an adhesive to form the Al layer and patterning the formed Al layer, the problem of voids can be avoided.

The slot electrode 55 includes a main layer such as a Cu layer or an Al layer. The slot electrode 55 may have a layered structure that includes the main layer as well as an upper layer and/or a lower layer disposed sandwiching the main layer therebetween. A thickness of the main layer may be configured in consideration of the skin effect depending on the material, and may be, for example, greater than or equal to 2 μm and less than or equal to 30 μm. The thickness of the main layer is typically greater than the thickness of the upper layer and the lower layer. For example, the main layer is a Cu layer, and the upper layer and the lower layer are Ti layers. By disposing the lower layer between the main layer and the third insulating layer 52, the adhesion between the slot electrode 55 and the third insulating layer 52 can be improved. In addition, by providing the upper layer, corrosion of the main layer (a Cu layer, for example) can be suppressed.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by, for example, a cutting out process can be used as the reflective conductive plate 65.

As illustrated in FIG. 12, the terminal section IT is provided in the non-transmission and/or reception region R2 of the slot substrate 201Aa. The terminal section IT includes the slot electrode 55, the fourth insulating layer 58 covering the slot electrode 55, and an upper connection section 60. The fourth insulating layer 58 includes an opening 58p that at least reaches the slot electrode 55. The upper connection section 60 is in contact with the slot electrode 55 within the opening 58p.

As illustrated in FIG. 12, in the transfer section, the upper connection section 60 of the terminal section IT of the slot substrate 201Aa is electrically connected to the transfer terminal upper connection section 19p of the transfer terminal section PT in the TFT substrate 101Aa. In the present embodiment, the upper connection section 60 and the transfer terminal upper connection section 19p are connected with a resin (e.g., sealing resin) 78 including conductive beads 71 interposed therebetween.

Each of the upper connection sections 60 and 19p is a transparent conductive layer such as an ITO film or an IZO film, and has a surface on which an oxide film may be formed. In a case where an oxide film is formed, the electrical connection between the transparent conductive layers cannot be ensured, and the contact resistance may increase. In contrast, in the present embodiment, since these transparent conductive layers are bonded with a resin including conductive beads (for example, Au beads) 71 therebetween, even in a case where a surface oxide film is formed, the conductive beads pierce (penetrate) the surface oxide film, allowing an increase in contact resistance to be suppressed. The conductive beads 71 may penetrate not only the surface oxide film but also penetrate the upper connection sections 60 and 19p which are the transparent conductive layers, and directly contact the patch connection section 15p and the slot electrode 55.

Note that the seal region Rs (seal portion 73Aa) may have the same structure as the transfer section described above. In other words, the transfer section described above may be disposed within the seal region Rs (seal portion 73Aa).

The slot substrate 201Aa can be manufactured by the following method, for example.

First, the third insulating layer 52 (having a thickness of 300 nm to 1500 nm, for example) is formed on the dielectric substrate 51 by CVD, for example. A substrate such as a glass substrate or a resin substrate having a high transmittance to electromagnetic waves (the dielectric constant $\varepsilon_M$ and the dielectric loss tan $\delta_M$ are small) can be used as the dielectric substrate 51. The dielectric substrate 51 is preferably thin in order to suppress the attenuation of the electromagnetic waves. For example, after forming the constituent elements such as the slot electrode 55 on the front face of the glass substrate by a process to be described later, the glass substrate may be thinned from the rear side. This allows the thickness of the glass substrate to be reduced to 500 μm or less, for example.

Note that in a case where a resin substrate is used as the dielectric substrate 51, constituent elements such as TFTs may be formed directly on the resin substrate, or may be formed on the resin substrate by a transfer method. In a case of the transfer method, for example, a resin film (for example, a polyimide film) is formed on the glass substrate, and after the constituent elements are formed on the resin film by the process to be described later, the resin film on which the constituent elements are formed is separated from the glass substrate. Generally, the dielectric constant $\varepsilon_M$ and the dielectric loss tan $\delta_M$ of resin are smaller than those of glass. The thickness of the resin substrate is, for example, from 3 μm to 300 μm. Besides polyimide, for example, a liquid crystal polymer can also be used as the resin material.

The third insulating layer 52 is not particularly limited to a specific film, and, for example, a silicon oxide ($SiO_x$) film, a silicon nitride ($SiN_x$) film, a silicon oxynitride ($SiO_xN_y$ (x>y)) film, a silicon nitride oxide ($SiN_xO_y$ (x>y)) film, or the like can be used as appropriate.

Next, a metal film (Cu film or Al film, for example) is formed on the third insulating layer 52 by sputtering, for example, and is patterned to obtain the slot electrode 55 including the plurality of slots 57 as illustrated in FIG. 11(a). As the metal film, a Cu film having a thickness of 1000 nm to 4000 nm may be used. As the metal film, a layered film (Cu/Ti) may be formed by layering a Ti film (having a thickness of 20 nm to 100 nm, for example) and a Cu film (having a thickness of 1000 nm to 4000 nm, for example) in this order.

After that, as illustrated in FIG. 11(b), the fourth insulating layer 58 (having a thickness of 50 nm to 400 nm, for example) is formed on the slot electrode 55 and within the slot 57. The material of the fourth insulating layer 58 may be the same as the material of the third insulating layer.

After that, in the non-transmission and/or reception region R2, an opening 58p that at least reaches the slot electrode 55 is formed in the fourth insulating layer 58. The opening 58p can be formed by photolithography, dry etching, and resist peeling and rinse.

After that, a transparent conductive film (having a thickness of 50 nm to 150 nm, for example) is formed on the fourth insulating layer 58 and within the opening 58p of the fourth insulating layer 58 by sputtering, and is patterned to form the upper connection section 60 in contact with the slot electrode 55 within the opening 58p. In this way, the terminal section IT can be obtained. An indium tin oxide (ITO) film, an IZO film, a zinc oxide (ZnO) film or the like can be used as the transparent conductive film. The transparent conductive film may have a layered structure including a Ti film (having a thickness of 20 nm to 50 nm, for example), and an ITO film, an IZO film, or a ZnO film in this order. In a case where the transparent conductive film includes a Ti film, corrosion of the slot electrode 55 is suppressed, and/or contact resistance between the slot electrode 55 and the upper connection section 60 is reduced. The transparent conductive film is patterned by photolithography, wet etching, and resist peeling and rinse to obtain a transparent conductive layer. After patterning the transparent conductive film, annealing treatment may be further performed for resistance reduction.

Next, as illustrated in FIG. 11(c), a photosensitive resin film is formed on the fourth insulating layer 58 and the transparent conductive layer formed on the fourth insulating layer 58, and the photosensitive resin film is exposed and developed via a photomask having openings with a predetermined pattern to form a columnar spacer PS. The photosensitive resin may be negative-working or positive-working.

In this manner, the slot substrate 201Aa is manufactured.

Note that in the case where the TFT substrate includes the columnar spacer PS, the columnar spacer may be formed by that the TFT substrate 101Aa is manufactured by the above method, and thereafter, a photosensitive resin film is formed on the second insulating layer 17 and the upper conductive layer 19, and then exposed and developed.

As illustrated in FIG. 11(d), the liquid crystal panel 100Aa is prepared by bonding the TFT substrate 101Aa and the slot substrate 201Aa manufactured as described above.

First, the seal portion 73Aa is formed as follows. A sealing member is used to draw a pattern having an opening at portion serving as the injection port 74a on one of the slot substrate 201Aa and the TFT substrate 101Aa (for example, on the TFT substrate 101Aa) using, for example, a dispenser. Furthermore, a sealing resin containing conductive particles is applied to a terminal section of the one substrate (the terminal section PT of the TFT substrate 101Aa or the terminal section IT of the slot substrate 201Aa). Instead of using a dispenser to draw with the sealing member, the sealing member may be applied in a predetermined pattern by screen printing, for example. Then, the sealing member is cured by overlaying the other substrate and heating for a predetermined amount of time at a predetermined temperature and a predetermined pressure. A granular spacer (e.g., resin beads) for controlling the cell gap is mixed into the sealing member, and the slot substrate 201Aa and the TFT substrate 101Aa are bonded and fixed to each other while maintaining a gap in which the liquid crystal layer LC is formed therebetween. Accordingly, the main seal portion 75Aa is formed.

Next, the liquid crystal layer LC is formed. A liquid crystal material is injected through the injection port 74a using vacuum injection. Then, for example, a thermosetting-type sealant is applied to close the injection port 74a, and the sealant is heated at a predetermined temperature for a predetermined time, to thereby cure the sealant and form the end seal portion (not illustrated). In the case where vacuum injection is used, the main seal portion 75Aa and the end seal portion (not illustrated) form the entire seal portion 73Aa surrounding the liquid crystal layer LC in this way.

Note that the liquid crystal layer LC may be formed using one drop filling as already described.

In a case where a plurality of TFT substrates or slot substrates are prepared from one mother glass substrate, after the seal portion is formed, each liquid crystal panel may be cut out by, for example, dicing or laser processing before forming the liquid crystal layers.

Figure 13:
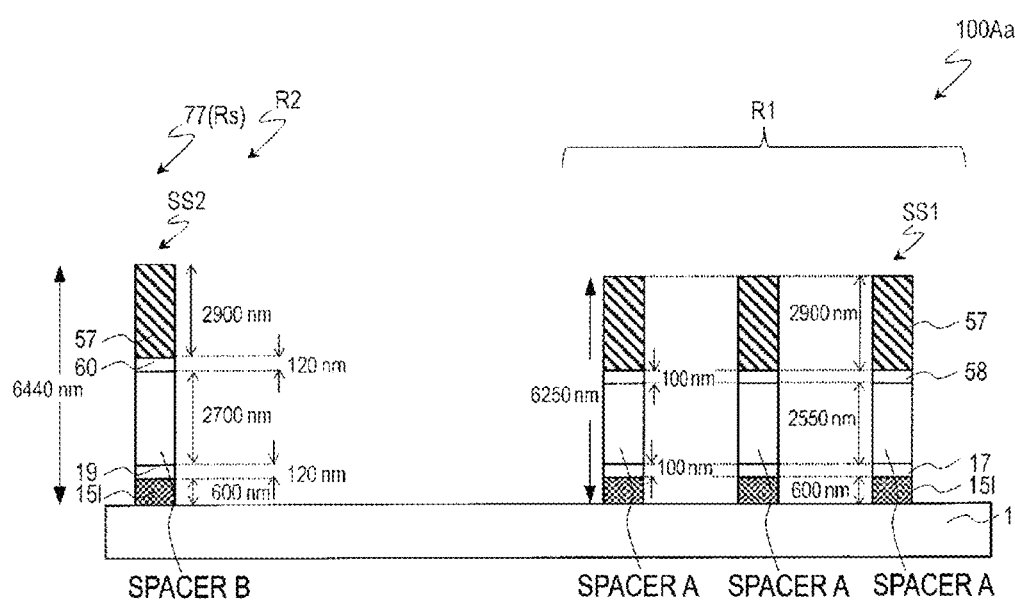
FIG. 13 is a diagram schematically illustrating an example of a spacer structure included in the liquid crystal panel 100Aa.

FIG. 13 schematically illustrates an example of a spacer structure included in the liquid crystal panel 100Aa.

FIG. 13 illustrates a first spacer structure SS1 that defines the gap (first gap) between the first dielectric substrate 1 and the second dielectric substrate 51 in the transmission and/or reception region R1, and a second spacer structure SS2 included in the wide gap portion 77. The second spacer structure SS2 (having a height of 6440 nm) is higher than the first spacer structure SS1 (having a height of 6250 nm) (a difference in the height between the first spacer structure SS1 and the second spacer structure SS2 is 0.19 µm). In the figure, examples of the heights of the conductive layers, insulating layers, and spacers included in each of the spacer structures are indicated. In the figure, a "spacer A" indicates the height of the columnar spacer included in the first spacer structure SS1, and a "spacer B" indicates the height of the spacer (columnar spacer or granular spacer) included in the second spacer structure SS2. However, the gate insulating layer 4, the first insulating layer 11, and the third insulating layer 52 are omitted. In this example, the first spacer structure SS1 and the second spacer structure SS2 further include the gate insulating layer 4, the first insulating layer 11, and the third insulating layer 52, the gate insulating layer 4, the first insulating layer 11, and the third insulating layer 52 do not contribute to the difference in the height between the first spacer structure SS1 and the second spacer structure SS2.

Figure 14:
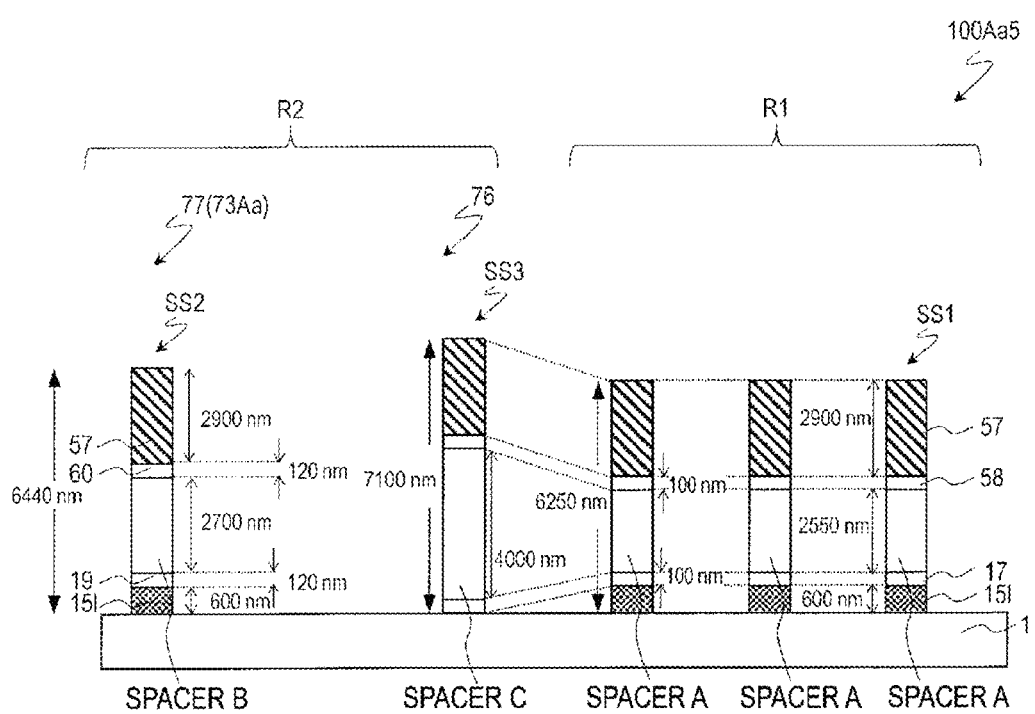
FIG. 14 is a diagram schematically illustrating an example of a spacer structure included in the liquid crystal panel 100Aa5.

FIG. 14 illustrates an example of a spacer structure included in the liquid crystal panel 100Aa5. As described above, the liquid crystal panel 100Aa5 further includes the additional seal portion 76.

FIG. 14 illustrates the first spacer structure SS1 that defines the gap (first gap) between the first dielectric substrate 1 and the second dielectric substrate 51 in the transmission and/or reception region R1, the second spacer structure SS2 included in the wide gap portion 77, and a third spacer structure SS3 included in the additional seal portion 76. The third spacer structure SS3 (having a height of 7100 nm) is higher than the first spacer structure SS1 (having the height of 6250 nm) (a difference in the height between the first spacer structure SS1 and the third spacer structure SS3 is 0.85 µm). In the figure, a "spacer C" indicates the height of the spacer (columnar spacer or granular spacer) included in the third spacer structure SS3. The second spacer structure SS2 and the third spacer structure SS3 are higher than the first spacer structure SS1, and the third spacer structure SS3 is higher than the second spacer structure SS2 (a difference in the height between the third spacer structure SS3 and the second spacer structure SS2 is 0.66 µm).

The present inventors estimated a size (width) of the region in which the vacuum bubble is formed when the temperature of the liquid crystal panel is decreased, using the liquid crystal panel 100Aa1 illustrated in FIG. 8(a). The width of the region in which the vacuum bubble is formed was measured by observing the liquid crystal panel with an optical microscope. In a case where the spacer structure included in the additional seal portion 76A includes a granular spacer having a particle diameter of 4.0 µm (a difference between the height of the spacer structure included in the additional seal portion 76A and the height of the spacer structure defining the first gap is 0.9 µm), a vacuum bubble was formed in a region of about 2 mm along the additional seal portion 76A when the temperature of the liquid crystal panel was decreased. In a case where the particle diameter of the granular spacer included in the spacer structure included in the additional seal portion 76A was changed to 6.1 µm (in this case, the difference between the height of the spacer structure included in the additional seal portion 76A and the height of the spacer structure defining the first gap is 3.0 µm), a vacuum bubble was formed in a region of about 4 mm along the additional seal portion 76A when the temperature of the liquid crystal panel was decreased.

Figure 15:
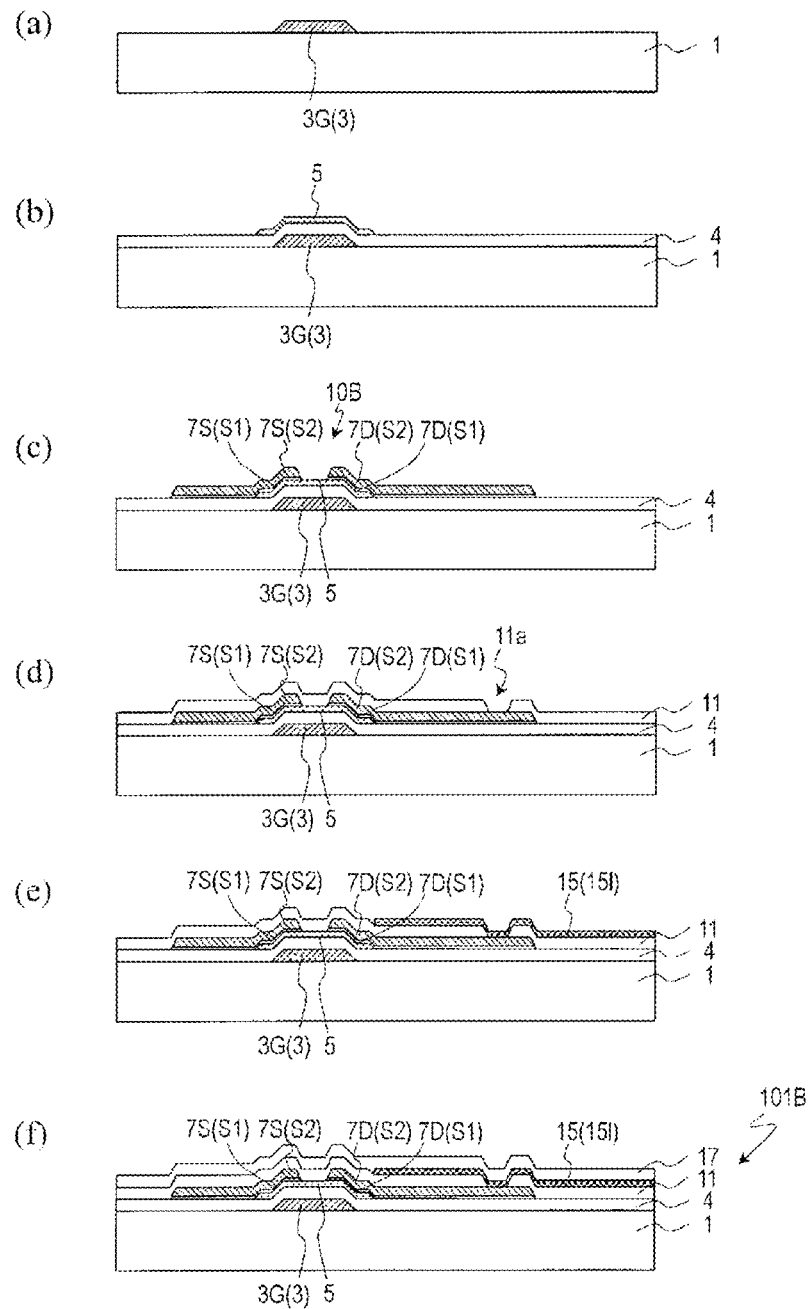
FIGS. 15(a) to 15(e) are schematic cross-sectional views for illustrating a method for manufacturing a TFT substrate 101B included in a scanning antenna according to a second embodiment of the disclosure.
FIG. 15(f) is a schematic cross-sectional view illustrating the TFT substrate 101B.

Referring to FIG. 15, a structure and manufacturing method of a TFT substrate 101B included in the scanning antenna according to a second embodiment of the disclosure. FIGS. 15(a) to 15(e) are schematic cross-sectional views for illustrating the method for manufacturing the TFT substrate 101B, and FIG. 15(f) is a schematic cross-sectional view illustrating the TFT substrate 101B. The following mainly describes differences from the previous embodiment. The constitutions common to the embodiment described above are denoted by the same reference signs and the descriptions thereof may be omitted. The same applies to subsequent embodiments.

As illustrated in FIG. 15(f), the TFT substrate 101B is different from the previous embodiment in that a contact layer is not provided between the semiconductor layer 5 and the source electrode 7S/drain electrode 7D. As the semiconductor layer 5 of the TFT substrate 101B included in the TFT 10B, an oxide semiconductor layer is used, for example. In the scanning antenna including the TFT substrate 101B having such a structure also, the same effect as in the first embodiment can be obtained. The TFT substrate 101B can be applied to any of the liquid crystal panels described above.

A description is given of a manufacturing method of the TFT substrate 101B with reference to FIGS. 15(a) to 15(e). The description mainly describes differences from the manufacturing method of the TFT substrate 101Aa described referring to FIG. 10.

First, the gate metal layer 3 including the gate electrode 3G is formed on the dielectric substrate 1 as illustrated in FIG. 15(a).

Next, the gate insulating layer 4 and the semiconductor layer 5 are formed as illustrated in FIG. 15(b).

Here, an In—Ga—Zn—O based semiconductor film (having a thickness of 30 nm to 300 nm, for example) is formed by sputtering, and is patterned by photolithography, wet etching, and resist peeling and rinse to obtain the semiconductor layer 5.

Next, a source conductive film is formed on the gate insulating layer 4, and patterned to form the source metal layer 7 including the source electrode 7S and the drain electrode 7D as illustrated in FIG. 15(c).

Here, as the source conductive film, a layered film (Cu/Ti) is formed by layering a Ti film (having a thickness of 20 nm to 100 nm, for example) and a Cu film (having a thickness of 100 nm to 400 nm, for example) in this order. Here, for example, the source conductive film (Ti film and Cu film) is formed by sputtering, and is subjected to photolithography, etching (the Cu film is wet etched, and then, the Ti film is dry etched), and resist peeling and rinse in this order to obtain the source metal layer 7 including the lower layer S1 and the upper layer S2. Accordingly, the TFT 10B is obtained.

Next, as illustrated in FIG. 15(d), the first insulating layer 11 is formed.

Next, a patch conductive film is formed on the first insulating layer 11 and within the opening 11a formed in the first insulating layer 11, and is patterned to form the patch metal layer 151 as illustrated in FIG. 15(e).

Next, as illustrated in FIG. 15(f), the second insulating layer 17 is formed on the patch metal layer 151 and on the first insulating layer 11.

Next, the upper conductive layer is formed on the second insulating layer 17.

In this manner, the TFT substrate 101B is obtained.

Figure 16:
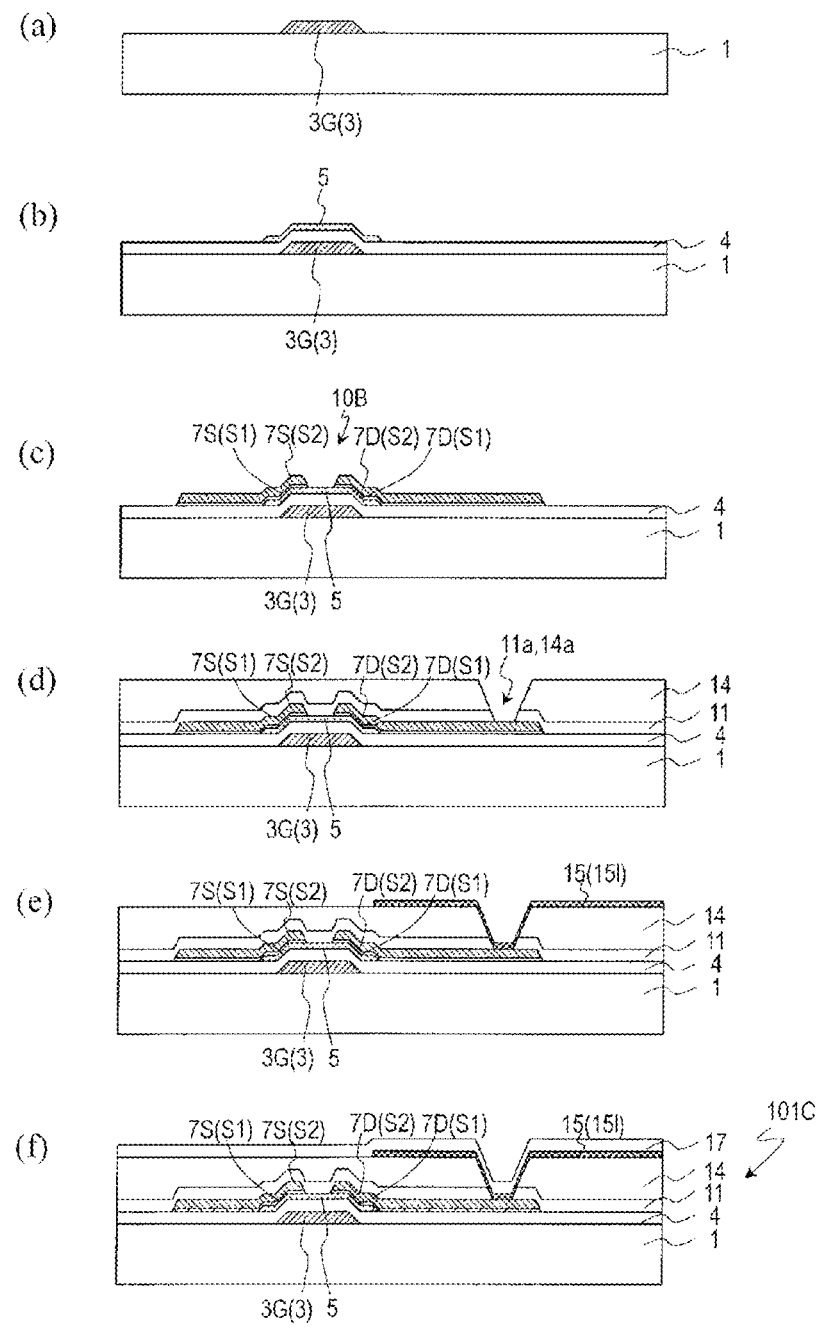
FIGS. 16(a) to 16(e) are schematic cross-sectional views for illustrating a method for manufacturing a TFT substrate 101C included in a scanning antenna according to a third embodiment of the disclosure.
FIG. 16(f) is a schematic cross-sectional view illustrating the TFT substrate 101C.

Referring to FIG. 16, a structure and manufacturing method of a TFT substrate 101C included in the scanning antenna according to a third embodiment of the present embodiment. FIGS. 16(a) to 16(e) are schematic cross-sectional views for illustrating the method for manufacturing the TFT substrate 101C, and FIG. 16(f) is a schematic cross-sectional view illustrating the TFT substrate 101C.

As illustrated in FIG. 16(f), the TFT substrate 101C differs from the TFT substrate 101B in that the TFT substrate 101C further includes a flattened layer 14 between the first insulating layer 11 and the patch metal layer 151. In the scanning antenna including the TFT substrate 101C having such a structure also, the same effect as in the first embodiment can be obtained. The TFT substrate 101C can be applied to any of the liquid crystal panels described above.

A description is given of a manufacturing method of the TFT substrate 101C with reference to FIGS. 16(a) to 16(e). The description mainly describes differences from the manufacturing method of the TFT substrate 101B described referring to FIG. 15.

First, the gate metal layer 3 including the gate electrode 3G is formed on the dielectric substrate 1 as illustrated in FIG. 16(a).

Next, the gate insulating layer 4 and the semiconductor layer 5 are formed as illustrated in FIG. 16(b).

Next, the source metal layer 7 including the source electrode 7S and the drain electrode 7D is formed on the gate insulating layer 4 as illustrated in FIG. 16(c).

Next, as illustrated in FIG. 16(d), the first insulating layer 11 is formed to cover the TFT 10B, and the flattened layer 14 is formed on the first insulating layer 11.

Here, a $SiN_x$ layer (having a thickness of 100 nm to 500 nm, for example) is formed by CVD to cover the TFT 10B to form a photosensitive resin film on the $SiN_x$ layer. After that, the photosensitive resin film is patterned by photolithography and the $SiN_x$ film is patterned by dry etching to form the opening 11a that at least reaches the drain electrode 7D in the first insulating layer 11 and form an opening 14a that overlaps the opening 11a is formed in the flattened layer 14.

Next, a patch conductive film is formed on the flattened layer 14 and within the opening 11a formed in first insulating layer 11, and is patterned to obtain the patch metal layer 151 as illustrated in FIG. 16(e).

Next, as illustrated in FIG. 16(f), the second insulating layer 17 is formed on the patch metal layer 151 and on the flattened layer 14.

Next, the upper conductive layer is formed on the second insulating layer 17.

In this manner, the TFT substrate 101C is obtained.

Figure 17:
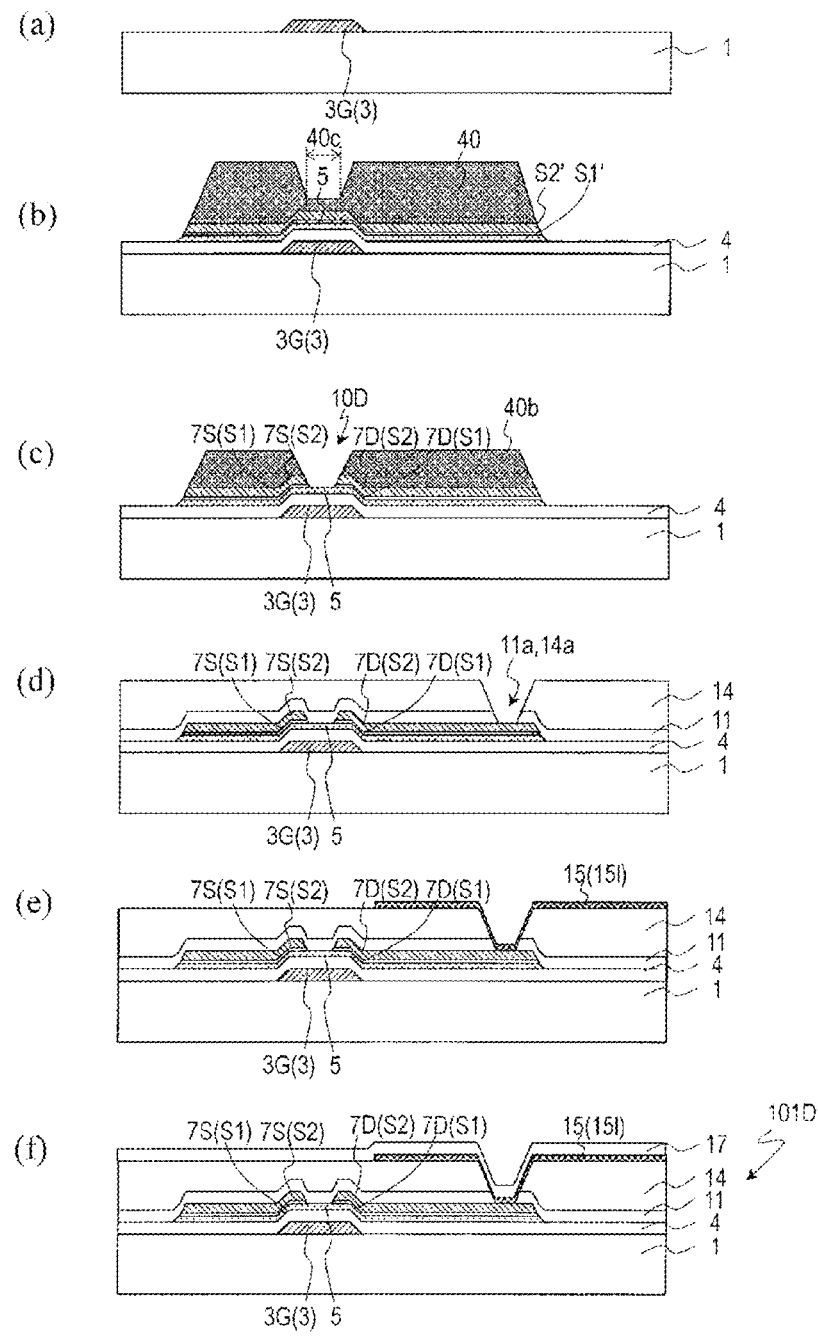
FIGS. 17(a) to 17(e) are schematic cross-sectional views for illustrating a method for manufacturing a TFT substrate 101D included in a scanning antenna according to a fourth embodiment of the disclosure.
FIG. 17(f) is a schematic cross-sectional view illustrating the TFT substrate 101D.

Referring to FIG. 17, a structure and manufacturing method of a TFT substrate 101D included in the scanning antenna according to a fourth embodiment of the present embodiment. FIGS. 17(a) to 17(e) are schematic cross-sectional views for illustrating the method for manufacturing the TFT substrate 101D, and FIG. 17(f) is a schematic cross-sectional view illustrating the TFT substrate 101D.

The TFT substrate 101D can be manufactured through manufacturing processes the number of which (for example, the number of photomasks) is less than the TFT substrate 101C.

A description is given of a manufacturing method of the TFT substrate 101D with reference to FIGS. 17(a) to 17(f). The description mainly describes differences from the manufacturing method of the TFT substrate 101C described referring to FIG. 16.

First, the gate metal layer 3 including the gate electrode 3G is formed on the dielectric substrate 1 as illustrated in FIG. 17(a).

Next, the gate insulating layer 4, the semiconductor layer 5, and source conductive films S1' and S2' are formed on the gate metal layer 3 as illustrated in FIG. 17(b).

Here, as the gate insulating layer 4, a $SiN_x$ layer (having a thickness of 100 nm to 500 nm, for example) is formed by CVD over an entire surface of the dielectric substrate 1. After that, an In—Ga—Zn—O based semiconductor film (having a thickness of 30 nm to 300 nm, for example) is formed on the gate insulating layer 4 by sputtering, and a Ti film (having a thickness of 30 nm to 100 nm, for example) and a Cu film (having a thickness of 100 nm to 400 nm, for example) are formed on the In—Ga—Zn—O based semiconductor film by sputtering. After that, the resist layer 40 is formed on the Cu film by photolithography and is used as an etching mask to pattern the In—Ga—Zn—O based semiconductor film, the Ti film, and the Cu film, and then, the semiconductor layer 5 and the source conductive films S1' and S2' are obtained. For example, the Cu film is patterned by wet etched, the Ti film is by dry etched, and the In—Ga—Zn—O based semiconductor film is by wet etching. In the process for forming the resist layer 40, a thickness of a portion 40c of the resist layer 40 is made smaller than other portions by being exposed using a multi-gray scale mask, the portion 40c serving as the channel region of the semiconductor layer 5 of the resist layer 40. A gray tone mask or a halftone mask can be used as the multi-gray scale mask. A slit that is less than or equal to the resolution of an exposure device is formed in the gray tone mask, and intermediate exposure is achieved by blocking a part of a light by the slit. On the other hand, intermediate exposure is achieved by using a semi-transparent film in the halftone mask.

Next, an ashing process is performed on the resist layer 40 to remove the portion 40c serving as the channel region of the semiconductor layer 5 of the resist layer 40 and obtain a resist layer 40b as illustrated in FIG. 17(c). After that, the source conductive films S1' and S2' are patterned (source/drain separation) using the resist layer 40b as an etching mask to form the source metal layer including the source electrode 7S and the drain electrode 7D. For example, the Cu film is wet etched and the Ti film is dry etched. Accordingly, the TFT 10D is obtained. After that, the resist layer 40b is removed by performing resist peeling and rinse.

Next, as illustrated in FIG. 17(d), the first insulating layer 11 is formed to cover the TFT 10D, and the flattened layer 14 is formed on the first insulating layer 11.

Next, a patch conductive film is formed on the flattened layer 14 and within the opening 11a formed in first insulating layer 11, and is patterned to obtain the patch metal layer 151 as illustrated in FIG. 17(e).

Next, as illustrated in FIG. 17(f), the second insulating layer 17 is formed on the patch metal layer 151 and on the flattened layer 14.

Next, the upper conductive layer is formed on the second insulating layer 17.

In this manner, the TFT substrate 101D is obtained.

As illustrated in FIG. 17(c), the TFT substrate 101D differs from the TFT substrate 101C in the shape of the semiconductor layer 5. In the scanning antenna including the TFT substrate 101D having such a structure also, the same effect as in the first embodiment can be obtained. The TFT substrate 101D can be applied to any of the liquid crystal panels described above.

Figure 18:
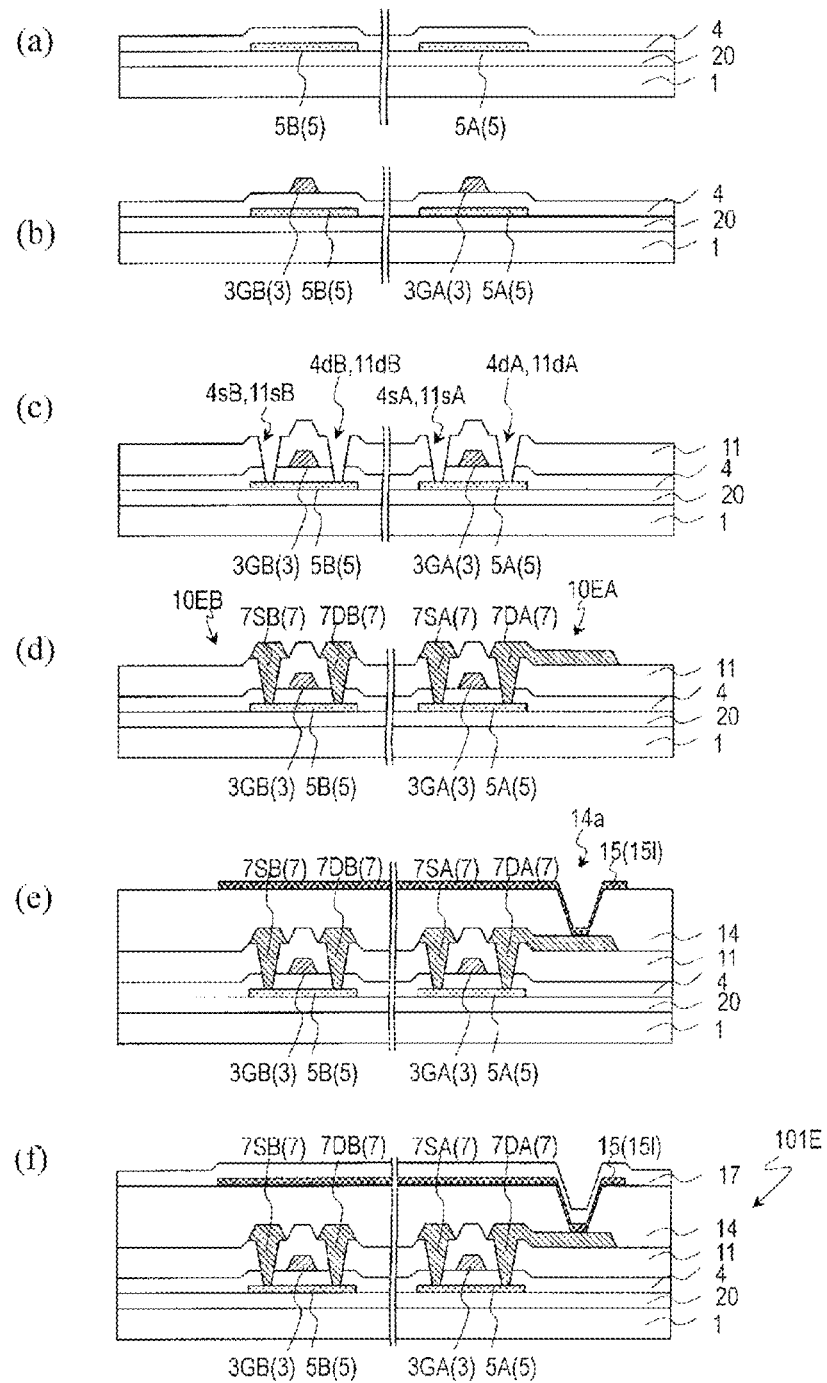
FIGS. 18(a) to 18(e) are schematic cross-sectional views for illustrating a method for manufacturing a TFT substrate 101E included in a scanning antenna according to a fifth embodiment of the disclosure.
FIG. 18(f) is a schematic cross-sectional view illustrating the TFT substrate 101E.

Referring to FIG. 18, a structure and manufacturing method of a TFT substrate 101E included in the scanning antenna according to a fifth embodiment of the disclosure. FIGS. 18(a) to 18(e) are schematic cross-sectional views for illustrating the method for manufacturing the TFT substrate 101E, and FIG. 18(f) is a schematic cross-sectional view illustrating the TFT substrate 101E.

FIG. 18(f) illustrates a TFT 10EA provided in the antenna unit region U of the TFT substrate 101E and a TFT 10EB provided in the drive circuit, for example, of the non-transmission and/or reception region R2. Here, the TFT 10EA and the TFT 10EB have the same structure and can be manufactured in the same processes as described with reference to FIGS. 18(a) to 18(f).

As illustrated in FIG. 18(f), TFT 10EA and TFT 10EB are TFTs having a top gate structure in which the gate electrode 3G is included above the semiconductor layer 5, and a top contact structure in which the source electrode and the drain electrode are in contact with the upper face of the semiconductor layer 5. The TFT substrate 101E includes the semiconductor layer 5 supported by the dielectric substrate 1, the gate metal layer 3 formed on the semiconductor layer 5, the gate insulating layer 4 formed between the semiconductor layer 5 and the gate metal layer 3, the source metal layer 7 formed on the gate metal layer 3, the first insulating layer 11 formed between the gate metal layer 3 and the source metal layer 7, the patch metal layer 151 formed on the source metal layer 7, the flattened layer 14 formed between the source metal layer and the patch metal layer 151, and the second insulating layer 17 formed on the patch metal layer 151.

In the scanning antenna including the TFT substrate 101E having such a structure also, the same effect as in the first embodiment can be obtained. The TFT substrate 101E can be applied to any of the liquid crystal panels described above.

A description is given of a manufacturing method of the TFT substrate 101E with reference to FIGS. 18(a) to 18(e). The following mainly describes differences from the previous embodiment.

First, as illustrated in FIG. 18(a), a base insulating layer 20, the semiconductor layer 5, and the gate insulating layer 4 are formed on the dielectric substrate 1.

The base insulating layer 20 (having a thickness of 100 nm to 300 nm, for example) can be formed by CVD. As the base insulating layer 20, a silicon oxide ($SiO_x$) layer, a silicon nitride ($SiN_x$) layer, a silicon oxynitride ($SiO_xN_y$, (x>y)) layer, a silicon nitride oxide ($SiN_xO_y$, (x>y)) layer, or the like may be used as appropriate. The base insulating layer 20 may have a layered structure. Note that the base insulating layer 20 may be omitted.

A Si film (having a thickness of 20 nm to 100 nm, for example) is formed on the base insulating layer 20 or on the dielectric substrate 1 and crystallized, and then, the semiconductor layer 5 including semiconductor layers 5A and 5B is obtained by photolithography and dry etching. The semiconductor layer 5 may be a crystalline silicon semiconductor layer (e.g., a low-temperature polysilicon layer).

The gate insulating layer 4 is formed on the semiconductor layer 5 by CVD or the like. As the gate insulating layer 4, a silicon oxide ($SiO_x$) layer, a silicon nitride ($SiN_x$) layer, a silicon oxynitride ($SiO_xN_y$, (x>y)) layer, a silicon nitride oxide ($SiN_xO_y$, (x>y)) layer, or the like may be used as appropriate. The gate insulating layer 4 may have a layered structure. Here, a $SiN_x$ layer (having a thickness of 50 nm to 200 nm, for example) is formed as the gate insulating layer 4.

Next, the gate metal layer 3 including gate electrodes 3GA and 3GB is formed on the gate insulating layer 4 as illustrated in FIG. 18(b).

A gate conductive film is formed on the gate insulating layer 4 by sputtering or the like and is patterned to obtain the gate metal layer 3 (having a thickness of 100 nm to 400 nm, for example). The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. For example, as the gate conductive film, a conductive film having a layered structure of W/Ta, Ti/Al, Ti/Al/Ti, Al/Ti, or the like, or an alloy film of MoW or the like can be used.

Next, as illustrated in FIG. 18(c), the first insulating layer 11 is formed on the gate metal layer 3, and a contact hole that at least reaches the source regions and drain regions of the semiconductor layers 5A and 5B is formed in the first insulating layer 11 and gate insulating layer 4 by known photolithography and dry etching. Openings 11sA and 4sA that at least reach the source region of the semiconductor layer 5A, and openings 11dA and 4dA that at least reach the drain region of the semiconductor layer 5A are formed in the first insulating layer 11 and the gate insulating layer 4. In the non-transmission and/or reception region R2 also, openings 11sB and 4sB that at least reach the source region of the semiconductor layer 5B, and openings 11dB and 4dB that at least reach the drain region of the semiconductor layer 5B are formed.

The first insulating layer 11 (having a thickness of 500 nm to 900 nm, for example) can be formed by CVD. As the first insulating layer 11, a silicon oxide ($SiO_x$) layer, a silicon nitride ($SiN_x$) layer, a silicon oxynitride ($SiO_xN_y$ (x>y)) layer, a silicon nitride oxide ($SiN_xO_y$ (x>y)) layer, or the like may be used as appropriate. The first insulating layer 11 may have a layered structure.

Next, a source conductive film is formed on the first insulating layer 11 and within the openings 4sA, 4dA, 4sB, and 4dB formed on the gate insulating layer 4, and patterned to form the source metal layer 7 including source electrodes 7SA and 7SB, and drain electrodes 7DA and 7DB as illustrated in FIG. 18(d).

A source conductive film is formed on the first insulating layer 11 and within the openings formed in the gate insulating layer 4 by sputtering or the like, and is patterned to obtain the source metal layer 7 (having a thickness of 200 nm to 400 nm, for example). The material of the gate conductive film is not particularly limited to a specific material. A film containing a metal such as aluminum (Al), tungsten (W), molybdenum (Mo), tantalum (Ta), chromium (Cr), titanium (Ti), or copper (Cu), an alloy thereof, or alternatively a metal nitride thereof can be appropriately used. For example, as the source conductive film, a conductive film having a layered structure of Ti/Al, Ti/Al/Ti, Al/Ti, TiN/Al/TiN, Mo/Al, Mo/Al/Mo, Mo/AlNd/Mo, MoN/Al/MoN, and the like can be used. Accordingly, the TFTs 10EA and TFT 10EB are obtained.

Next, as illustrated in FIG. 18(e), the flattened layer 14 is formed on the source metal layer 7, and the patch metal layer 151 is formed on the flattened layer 14.

A photosensitive resin film is formed on the source metal layer 7, and the photosensitive resin film is patterned by photolithography to form the opening 14a that at least reaches the drain electrode 7D of the TFT 10EA. Accordingly, the flattened layer 14 is obtained.

A patch conductive film is formed on the flattened layer 14 and within the opening 14a, and is patterned to obtain the patch metal layer 151 including the patch electrode 15. As illustrated in the figure, when the patch metal layer 151 is formed to cover the TFT 10EB provided in the non-transmission and/or reception region R2, the advantage is achieved that the patch metal layer 151 functions as a light-shielding film for the semiconductor layer 5 of the TFT 10EB, and the leakage current caused by light incident on the channel region of the semiconductor layer 5 can be reduced. The patch metal layer 151 of the non-transmission and/or reception region R2 may not be electrically connected to the patch electrode 15. Note that the patch metal layer 151 of the non-transmission and/or reception region R2 may be omitted. Here, a Cu film (having a thickness of 200 nm to 1000 nm, for example) is used as the patch conductive film. As the patch conductive film, a layered film (Cu/Ti) formed by layering a Ti film (having a thickness of 20 nm to 100 nm, for example) and a Cu film (having a thickness of 200 nm to 1000 nm, for example) in this order may be used. By providing the Ti film under the Cu film, adhesion between the flattened layer 14 and the patch metal layer 151 can be improved. Here, patterning of the patch conductive film is performed by photolithography, wet etching, and resist peeling and rinse.

Next, as illustrated in FIG. 18(f), the second insulating layer 17 is formed on the patch electrode 15 and on the flattened layer 14.

Next, the upper conductive layer is formed on the second insulating layer 17.

In this manner, the TFT substrate 101E is obtained.

Material and Structure of TFT

In the embodiments of the disclosure, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. When the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a drive circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

In the example described above, the TFT 10A is a channel etch type TFT having a bottom gate structure. The "channel etch type TFT" does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, a surface portion of the channel region may be etched.

Note that the TFT may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10A has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT may have a bottom gate structure having a gate electrode on the dielectric substrate side of the semiconductor layer, or a top gate structure having a gate electrode above the semiconductor layer.

Example of Antenna Unit Array and Connection of Gate Bus Line and Source Bus Line In the scanning antenna according to the embodiments of the disclosure, the antenna units are arrayed concentrically, for example.

For example, in a case where the antenna units are arrayed in m concentric circles, one gate bus line is provided for each circle, for example, such that a total of m gate bus lines is provided. For example, assuming that the outer diameter of the transmission and/or reception region R1 is 800 mm, m is 200, for example. Assuming that the innermost gate bus line is the first one, n (30, for example) antenna units are connected to the first gate bus line and nx (620, for example) antenna units are connected to the m-th gate bus line.

In such an array, the number of antenna units connected to each gate bus line is different. In addition, although m antenna units are connected to n source bus lines that are also connected to the antenna units constituting the innermost circle, among nx source bus lines connected to nx antenna units that constitute the outermost circle, the number of antenna units connected to other source bus lines is less than m.

In this way, the array of antenna units in the scanning antenna is different from the array of pixels (dots) in the LCD panel, and the number of connected antenna units differs depending on the gate bus line and/or source bus line. Accordingly, in a case where the capacitances (liquid crystal capacitances+auxiliary capacities) of all the antenna units are set to be the same, depending on the gate bus line and/or the source bus line, the electrical loads of the antenna units connected thereto differ. In such a case, there is a problem where variations occur in the writing of the voltage to the antenna unit.

Accordingly, to prevent this, the capacitance value of the auxiliary capacity is preferably adjusted, or the number of antenna units connected to the gate bus line and/or the source bus line is preferably adjusted, for example, to make the electrical loads of the antenna units connected to the gate bus lines and the source bus lines substantially the same.

The scanning antenna according to the embodiments of the disclosure is housed in a plastic housing as necessary, for example. It is preferable to use a material having a small dielectric constant $\varepsilon_M$ that does not affect microwave transmission and/or reception in the housing. In addition, the housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101 and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

The embodiments according to the disclosure are applied to scanning antennas for satellite communication or satellite broadcasting that are mounted on mobile bodies (ships, aircraft, and automobiles, for example) or to the manufacture thereof.

REFERENCE SIGNS LIST

1 Dielectric substrate
3 Gate metal layer

3G Gate electrode
4 Gate insulating layer
5 Semiconductor layer
6D Drain contact layer
6S Source contact layer
7 Source metal layer
7D Drain electrode
7S Source electrode
11 First insulating layer
14 Flattened layer
15 Patch electrode
151 Patch metal layer
19 Upper conductive layer
19p Upper connection section
20 Base insulating layer
51 Dielectric substrate
52 Third insulating layer
54 Dielectric layer (air layer)
55 Slot electrode
57 Slot
58 Fourth insulating layer
65 Reflective conductive plate
70 Power feed device
72 Power feed pin
73a, 73Aa Seal portion
74a Injection port
75a, 75Aa Main seal portion
76, 76a to 76D Additional seal
77 Wide gap portion
100Aa, 100Aa1 to 100Aa5 Liquid crystal panel
101, 101a, 101Aa, 101B, 101C, 101D, 101E TFT substrate
201, 201a, 201Aa Slot substrate
301 Waveguide
1000 Scanning antenna
CL CS bus line
GD Gate driver
GL Gate bus line
GT Gate terminal section
SD Source driver
SL Source bus line
ST Source terminal section
PT Transfer terminal section
IT Terminal section
LC Liquid crystal layer
R1 Transmission and/or reception region
R2 Non-transmission and/or reception region
Rs Seal region
U Antenna unit, Antenna unit region

The invention claimed is:

1. A scanning antenna with a transmission and/or reception region including a plurality of antenna units and a non-transmission and/or reception region other than the transmission and/or reception region, the scanning antenna comprising:
   a TFT substrate including a first dielectric substrate and, a plurality of TFTs, a plurality of gate bus lines, a plurality of source bus lines, and a plurality of patch electrodes, supported by the first dielectric substrate;
   a slot substrate including a second dielectric substrate and a slot electrode formed on a first main surface of the second dielectric substrate, the slot electrode including a plurality of slots arranged corresponding to the plurality of patch electrodes;
   a liquid crystal layer provided between the TFT substrate and the slot substrate;
   a seal portion provided in the non-transmission and/or reception region and surrounding the liquid crystal layer;
   a reflective conductive plate disposed opposing a second main surface of the second dielectric substrate on a side opposite to the first main surface with a dielectric layer interposed between the reflective conductive plate and the second main surface,
   a first spacer structure disposed in the transmission and/or reception region, and defining a first gap between the first dielectric substrate and the second dielectric substrate in the transmission and/or reception region; and
   a second spacer structure defining a second gap between the first dielectric substrate and the second dielectric substrate in the non-transmission and/or reception region, the second gap being wider than the first gap, and
   wherein the second spacer structure is disposed within the seal portion or within a region surrounded by the seal portion.

2. The scanning antenna according to claim 1, wherein the liquid crystal layer contains a vacuum bubble when a temperature of the liquid crystal layer is 25° C., and the liquid crystal layer does not contain a vacuum bubble when a temperature of the liquid crystal layer is 120° C. or higher.

3. The scanning antenna according to claim 1, wherein the first spacer structure includes a first columnar spacer defining a thickness of the liquid crystal layer between the plurality of patch electrodes and the slot electrode, and
the second spacer structure includes a spacer higher than the first columnar spacer.

4. The scanning antenna according to claim 1, wherein the seal portion includes a first granular spacer defining a thickness of the liquid crystal layer in the transmission and/or reception region, and
the second spacer structure includes a second granular spacer having a particle diameter greater than the first granular spacer.

5. The scanning antenna according to claim 1, wherein the second spacer structure is disposed within the seal portion.

6. The scanning antenna according to claim 1, further comprising:
   a third spacer structure defining a third gap between the first dielectric substrate and the second dielectric substrate in the non-transmission and/or reception region, and disposed within the region surrounded by the seal portion, the third gap being wider than the first gap; and
   an additional seal portion including the third spacer structure.

7. The scanning antenna according to claim 6, wherein assuming, when viewed from a normal direction of the first dielectric substrate, a smallest rectangle containing the TFT substrate and the slot substrate, the additional seal portion includes a portion formed in a region along a side where a notch from the rectangle is the largest.

8. The scanning antenna according to claim 6, wherein a height of the third spacer structure is greater than a height of the second spacer structure.

9. The scanning antenna according to claim 6, wherein the region surrounded by the seal portion includes an active region including the transmission and/or reception region, and a buffer region other than the active region, and the additional seal portion is provided between the active region and the buffer region.

10. The scanning antenna according to claim 9, wherein the seal portion includes a main seal portion defining an injection port and an end seal portion sealing the injection port, and the additional seal portion is formed such that liquid crystal material injected from the injection port is filled through the active region into the buffer region.

11. The scanning antenna according to claim 9, wherein the buffer region includes a region having a width of 5 mm to 15 mm.

12. A method for manufacturing the scanning antenna, the scanning antenna being according to claim 1, the method comprising:

a step for forming the liquid crystal layer, the step for forming the liquid crystal layer includes a step for supplying liquid crystal material to generate a vacuum bubble within a region between the TFT substrate and the slot substrate, and surrounded by the seal portion.

13. The method for manufacturing the scanning antenna according to claim 12, wherein the step for forming the liquid crystal layer further includes a step for increasing the temperature of the liquid crystal layer to 120° C. or more after the step for supplying the liquid crystal material.

14. The method for manufacturing the scanning antenna according to claim 12, wherein the liquid crystal layer is formed using a vacuum injection method.

15. The method for manufacturing the scanning antenna according to claim 12, wherein the liquid crystal layer is formed using one drop filling, and the step for forming the liquid crystal layer includes a step for dropping an amount of liquid crystal material smaller than a volume of the region between the TFT substrate and the slot substrate, and surrounded by the seal portion.

* * * * *